(12) United States Patent
Kim

(10) Patent No.: US 11,245,095 B2
(45) Date of Patent: Feb. 8, 2022

(54) ORGANIC LIGHT EMITTING DISPLAY OLED SCREEN AND TERMINAL

(71) Applicant: Huawei Technologies Co., Ltd., Shenzhen (CN)

(72) Inventor: Doyoung Kim, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 43 days.

(21) Appl. No.: 16/644,876

(22) PCT Filed: Sep. 7, 2017

(86) PCT No.: PCT/CN2017/100952
§ 371 (c)(1),
(2) Date: Mar. 5, 2020

(87) PCT Pub. No.: WO2019/047126
PCT Pub. Date: Mar. 14, 2019

(65) Prior Publication Data
US 2020/0287161 A1    Sep. 10, 2020

(51) Int. Cl.
| | |
|---|---|
| *H01L 51/52* | (2006.01) |
| *H01L 27/32* | (2006.01) |
| *H01L 51/50* | (2006.01) |
| *H04M 1/02* | (2006.01) |

(52) U.S. Cl.
CPC ........ *H01L 51/5253* (2013.01); *H01L 27/323* (2013.01); *H01L 27/3211* (2013.01); *H01L 51/5056* (2013.01); *H01L 51/5072* (2013.01); *H01L 51/5092* (2013.01); *H01L 51/5293* (2013.01); *H01L 27/3234* (2013.01); *H04M 1/0266* (2013.01); *H04M 2250/22* (2013.01)

(58) Field of Classification Search
CPC ... H01L 27/3211; H01L 27/3225–3234; H01L 51/524–5256
See application file for complete search history.

(56) References Cited

U.S. PATENT DOCUMENTS

| | | |
|---|---|---|
| 2011/0156191 A1 | 6/2011 | Lin et al. |
| 2013/0021289 A1 | 1/2013 | Chen et al. |
| 2014/0145150 A1 | 5/2014 | De Jong et al. |
| 2014/0183472 A1 | 7/2014 | Kim et al. |
| 2015/0108443 A1 | 4/2015 | Huh et al. |

(Continued)

FOREIGN PATENT DOCUMENTS

| | | |
|---|---|---|
| CN | 103700687 A | 4/2014 |
| CN | 104485349 A | 4/2015 |

(Continued)

*Primary Examiner* — Daniel P Shook
(74) *Attorney, Agent, or Firm* — Conley Rose, P.C.

(57) ABSTRACT

An organic light emitting display (OLED) screen and a terminal related to the field of terminal technologies, where the OLED screen includes an encapsulation layer and a substrate disposed below the encapsulation layer, in a first part of the OLED screen, the encapsulation layer is bonded to the substrate, and in a second part of the OLED screen, the OLED screen further includes a light emitting layer, where the light emitting layer is disposed between the encapsulation layer and the substrate, and the light emitting layer includes red light emitting pixels, green light emitting pixels, and blue light emitting pixels.

20 Claims, 18 Drawing Sheets

(56) References Cited

U.S. PATENT DOCUMENTS

| | | |
|---|---|---|
| 2016/0013451 A1 | 1/2016 | Cheng et al. |
| 2016/0041667 A1 | 2/2016 | Lai et al. |
| 2016/0137769 A1 | 5/2016 | Kwack et al. |
| 2016/0204169 A1 | 7/2016 | Oh et al. |
| 2016/0343787 A1 | 11/2016 | Wu |
| 2017/0070679 A1 | 3/2017 | Chung et al. |
| 2017/0214003 A1 | 7/2017 | Lee et al. |
| 2017/0221976 A1 | 8/2017 | Park et al. |
| 2017/0287992 A1* | 10/2017 | Kwak ................. H01L 27/3234 |
| 2018/0006271 A1 | 1/2018 | Tang |
| 2018/0331320 A1 | 11/2018 | Su et al. |
| 2019/0122608 A1 | 4/2019 | Kang et al. |
| 2019/0245020 A1 | 8/2019 | Choi et al. |

FOREIGN PATENT DOCUMENTS

| | | |
|---|---|---|
| CN | 104536179 A | 4/2015 |
| CN | 104885250 A | 9/2015 |
| CN | 105334994 A | 2/2016 |
| CN | 105601810 A | 5/2016 |
| CN | 105938873 A | 9/2016 |
| CN | 106505086 A | 3/2017 |
| CN | 106876328 A | 6/2017 |
| CN | 107025875 A | 8/2017 |
| CN | 107026190 A | 8/2017 |
| CN | 107039493 A | 8/2017 |
| EP | 3139422 A2 | 3/2017 |
| EP | 3200234 A1 | 8/2017 |
| EP | 3660905 A1 | 6/2020 |

* cited by examiner

ORGANIC LIGHT EMITTING DISPLAY OLED SCREEN AND TERMINAL

CROSS-REFERENCE TO RELATED APPLICATIONS

This application is a U.S. National Stage of International Patent Application No. PCT/CN2017/100952 filed on Sep. 7, 2017, which is hereby incorporated by reference in its entirety.

TECHNICAL FIELD

This application relates to the field of terminal technologies, and in particular, to an organic light emitting display (organic light emitting display, OLED) screen and a terminal.

BACKGROUND

Full-screen displays have become a development trend of current mobile phone screen display technologies. Because space needs to be reserved for a front-facing camera in a display region of a screen, manufacturers are currently unable to produce a full-screen mobile phone in a real sense.

For example, a drilling solution is used in the prior art, to dispose a front-facing camera on a front panel of a mobile phone. Referring to FIG. 1a, the drilling solution means that a small hole 02 is drilled in a mobile phone screen 01 and a camera 03 is disposed inside the small hole 02. In this way, the rest region other than the small hole 02 on the screen 01 can be used for the mobile phone to display a graphical user interface (graphical user interface, GUI), for example, information, an image, and various menus provided for a user by the mobile phone.

Mobile phone screens may mainly include liquid crystal display (liquid crystal display, LCD) screens and organic light emitting display OLED screens. The OLED screen usually uses an organic light emitting material as a light emitting layer, which is capable of self-luminance, and has advantages such as low power consumption and fast response, obtaining increasing attention.

For the OLED screen, when the drilling solution shown in FIG. 1a is used, a sectional view of an OLED screen 01 shown in FIG. 1c may be obtained based on a section line 001 shown in FIG. 1b. In FIG. 1c, 011 represents a common layer (common layer) made of an organic material, 012 represents an encapsulation layer (encapsulation layer), and 013 represents a substrate (substrate). Because the organic material is likely to absorb substances such as moisture and gases, in the small hole 02 shown in FIG. 1c, harmful substances (denoted by circles in FIG. 1c) such as moisture and harmful gases (for example, oxygen) in air are likely to enter the inside of the OLED screen 01 through the common layer 011 made of the organic material, and consequently, for example, light emitting pixels of the OLED screen 01 become dark, affecting performance and service lives of the OLED screen 01 and the mobile phone.

SUMMARY

Embodiments of this application provide an organic light emitting display OLED screen and a terminal which can prevent harmful substances such as moisture in air from entering the inside of the OLED screen.

To achieve the foregoing objective, the following technical solutions are used in the embodiments of this application.

According to a first aspect, an embodiment of this application provides an organic light emitting display OLED screen 10, including an encapsulation layer 11 and a substrate 12 disposed below the encapsulation layer 11. In a first part 101 of the OLED screen 10, the encapsulation layer 11 is bonded to the substrate 12. In a second part 102 of the OLED screen 10, the OLED screen 10 further includes a light emitting layer 13, where the light emitting layer 13 is disposed between the encapsulation layer 11 and the substrate 12, and the light emitting layer 13 includes red light emitting pixels, green light emitting pixels, and blue light emitting pixels.

In this way, layers inside the OLED screen 10 are tightly bonded. Therefore, harmful substances such as moisture in air can be prevented from passing through the layers to enter the inside of the OLED screen 10.

With reference to the first aspect, in a possible implementation, a transmittance of the first part 101 of the OLED screen 10 is greater than or equal to a preset value.

In this way, the first part 101 of the OLED screen 10 may be transparent. Therefore, when a device is disposed at a position that is below the OLED screen 10 and that corresponds to the first part 101, the OLED screen 10 at the transparent part does not affect incidence and emission of light for the device. Therefore, an optical device sensitive to light can be disposed below a transparent window.

With reference to the first aspect and the possible implementation, in a possible implementation, a position that is below the OLED screen 10 and that corresponds to the first part 101 is used to dispose an optical device 21.

In this way, corresponding to a position of the first part 101, an optical device such as a camera may be disposed at any position of the OLED screen, which is different from an existing notch solution in which the optical device can be disposed only in an edge region of the OLED screen 10 by using a notch.

With reference to the first aspect and the possible implementations, in another possible implementation, the optical device 21 includes at least one of a camera 22, an indicator lamp 23, a light sensor, or a distance sensor.

In this way, the optical device, such as the indicator lamp or an optical sensor, disposed below the screen 10 can also work normally.

With reference to the first aspect and the possible implementations, in another possible implementation, the substrate 12 is a transparent polyimide (polyimide, PI) resin base board or a glass base board.

In this way, the colorless transparent substrate does not affect, in terms of color, the optical device covered by the first part 101.

With reference to the first aspect and the possible implementations, in another possible implementation, the OLED screen 10 further includes a common layer 14 disposed between the encapsulation layer 11 and the substrate 12, where the encapsulation layer 11 and the substrate 12 are configured to isolate the common layer 14 from air, and the common layer 14 includes at least one of a hole layer or an electron layer. In the first part 101 of the OLED screen 10, the common layer 14 is bonded to the substrate 12, and the encapsulation layer 11 is bonded to the common layer 14. In the second part 102 of the OLED screen 10, the common layer 14 includes a first sublayer 141 and a second sublayer 142, and the light emitting layer 13 is located between the first sublayer 141 and the second sublayer 142.

Because the encapsulation layer 11, the common layer 14, and the substrate 12 are tightly bonded, no gap is left between the encapsulation layer 11, the common layer 14, and the substrate 12, and the encapsulation layer 11 and the substrate 12 may isolate the common layer 14 from outside air to prevent the common layer 14 from being in direct contact with air. Therefore, harmful substances such as moisture in air can be prevented from entering the inside of the screen 10 through the common layer 14 to affect performance of the OLED screen 10.

With reference to the first aspect and the possible implementations, in another possible implementation, the hole layer includes a hole injection layer and a hole transfer layer, the electron layer includes an electron injection layer and an electron transfer layer, the first sublayer 141 includes a cathode, a capping layer, the electron injection layer, and the electron transfer layer, the second sublayer 142 includes the hole transfer layer and the hole injection layer, and the second sublayer 142 is located below the first sublayer 141.

In this way, the common layer 14 can drive the light emitting layer 13 to emit light through the cathode, the capping layer, the electron injection layer, the electron transfer layer, the hole transfer layer, and the hole injection layer.

With reference to the first aspect and the possible implementations, in another possible implementation, the OLED screen 10 further includes a cover 15, where the cover 15 is disposed on an upper layer of the encapsulation layer 11.

The cover 15 may be configured to protect a device inside the OLED screen 10.

With reference to the first aspect and the possible implementations, in another possible implementation, in the second part 102 of the OLED screen 10, the OLED screen 10 further includes a polarizer 16, where the polarizer 16 is disposed between the encapsulation layer 11 and the cover 15.

In this way, a display contrast of the OLED screen 10 may be improved by using the polarizer 16.

With reference to the first aspect and the possible implementations, in another possible implementation, in the first part 101 of the OLED screen 10, the OLED screen 10 further includes a first clear colloid 17, where the first clear colloid 17 is configured to fill a gap between the encapsulation layer 11 and the cover 15.

In this way, the gap between the encapsulation layer 11 and the cover 15 is filled with the first clear colloid 17, so that the cover 15 and the encapsulation layer 11 are bonded to each other. Therefore, the OLED screen 10 is firmer, and air in the gap can be further exhausted, preventing the air in the gap from affecting performance of devices in the OLED screen 10, and improving reliability of the OLED screen 10.

With reference to the first aspect and the possible implementations, in another possible implementation, the first clear colloid 17 includes an optical clear resin (optical clear resin, OCR) or an optical clear adhesive (optically clear adhesive, OCA).

When the OCR is used, the gap between the encapsulation layer 11 and the cover 15 can be filled more sufficiently, so that the cover 15 and the encapsulation layer 11 can be tightly bonded. In addition, light scattering caused by external light, backlight, and the like can be further suppressed, improving a contrast of the OLED screen 10.

With reference to the first aspect and the possible implementations, in another possible implementation, in the second part 102 of the OLED screen 10, the OLED screen 10 further includes a back plane 18, where a thin film transistor (thin film transistor, TFT) is disposed on the back plane 18, and the back plane 18 is disposed between the second sublayer 142 and the substrate 12.

The TFT on the back plane 18 may be configured to cooperate with the common layer 14 to drive the light emitting layer 13 to emit light.

With reference to the first aspect and the possible implementations, in another possible implementation, an anode is further disposed on the back plane 18.

The anode on the back plane 18 may be configured to cooperate with the TFT and the common layer 14 to drive the light emitting layer 13 to emit light.

With reference to the first aspect and the possible implementations, in another possible implementation, the OLED screen 10 further includes a rear film 19 disposed below the substrate 12.

The rear film 19 may be configured to support and reinforce the substrate 12.

With reference to the first aspect and the possible implementations, in another possible implementation, in the second part 102 of the OLED screen 10, the OLED screen 10 further includes a touch sensor 110.

In this way, the OLED screen 10 directly under the second part 102 is a touchscreen.

With reference to the first aspect and the possible implementations, in another possible implementation, in the first part 101 and the second part 102 of the OLED screen 10, the touch sensor 110 is integrated into the cover 15.

In this way, the entire OLED screen 10 is a touchscreen.

With reference to the first aspect and the possible implementations, in another possible implementation, in the second part 102 of the OLED screen 10, the touch sensor 110 is integrated into the polarizer 16.

In this way, the second part 102 of the OLED screen 10 is an oncell touchscreen.

With reference to the first aspect and the possible implementations, in another possible implementation, the encapsulation layer is an encapsulation glass layer or a thin film encapsulation (thin film encapsulation. TFE) layer.

In other words, the encapsulation layer 11 may specifically be a non-bendable encapsulation glass layer, or a thin film encapsulation layer with relatively high flexibility.

With reference to the first aspect and the possible implementations, in another possible implementation, in the second part 102 of the OLED screen 10, the OLED screen 10 further includes a second clear colloid 120 and a third clear colloid 130. The second clear colloid 120 is located between the polarizer 16 and the cover 15. The third clear colloid 130 is located between the polarizer 16 and the encapsulation layer 11.

In this way, the second clear colloid 120 and the third clear colloid 130 can enable the polarizer 16, the cover 15, and the encapsulation layer 11 to be tightly bonded, and air between the polarizer 16 and the cover 15 and air between the polarizer 16 and the encapsulation layer 11 can be exhausted, preventing the polarizer 16, the encapsulation layer 11, the cover 15, or another component of the OLED screen 10 from being affected by harmful substances in air.

With reference to the first aspect and the possible implementations, in another possible implementation, in the second part 102 of the OLED screen 10, the OLED screen 10 further includes at least one of a cushion layer 140 or a heat sink layer 150, where the heat sink layer 150 includes a metal sheet or a graphite sheet.

The cushion layer 140 is configured to reduce external impact on each device in the OLED screen 10, and the heat sink layer 150 is configured to dissipate heat generated inside the OLED screen 10.

According to a second aspect, an embodiment of this application provides a terminal 20, including an organic light emitting display OLED screen 10 and an optical device 21. The OLED screen 10 includes an encapsulation layer 11 and a substrate 12 disposed below the encapsulation layer 11. In a first part 101 of the OLED screen 10, the encapsulation layer 11 is bonded to the substrate 12. The optical device 21 is disposed at a position that is below the OLED screen 10 and that corresponds to the first part 101. In a second part 102 of the OLED screen 10, the OLED screen 10 further includes a light emitting layer 13, where the light emitting layer 13 is disposed between the encapsulation layer 11 and the substrate 12, and the light emitting layer 13 includes red light emitting pixels, green light emitting pixels, and blue light emitting pixels.

With reference to the second aspect, in a possible implementation, a transmittance of the first part 101 of the OLED screen 10 is greater than or equal to a preset value.

With reference to the second aspect and the possible implementation, in another possible implementation, at least one part of the optical device 21 is built inside the OLED screen 10.

With reference to the second aspect and the possible implementations, in another possible implementation, the optical device 21 includes at least one of a camera 22, an indicator lamp 23, a light sensor, or a distance sensor.

With reference to the second aspect and the possible implementations, in another possible implementation, the OLED screen 10 further includes a common layer 14 disposed between the encapsulation layer 11 and the substrate 12, where the encapsulation layer 11 and the substrate 12 are configured to isolate the common layer 14 from air, and the common layer 14 includes at least one of a hole layer or an electron layer. In the first part 101 of the OLED screen 10, the common layer 14 is bonded to the substrate 12, and the encapsulation layer 11 is bonded to the common layer 14. In the second part 102 of the OLED screen 10, the common layer 14 includes a first sublayer 141 and a second sublayer 142, and the light emitting layer 13 is located between the first sublayer 141 and the second sublayer 142.

With reference to the second aspect and the possible implementations, in another possible implementation, the hole layer includes a hole injection layer and a hole transfer layer, the electron layer includes an electron injection layer and an electron transfer layer, the first sublayer 141 includes a cathode, a capping layer, the electron injection layer, and the electron transfer layer, the second sublayer 142 includes the hole transfer layer and the hole injection layer, and the second sublayer 142 is located below the first sublayer 141.

With reference to the second aspect and the possible implementations, in another possible implementation, in the second part 102 of the OLED screen 10, the OLED screen 10 further includes a back plane 18, where a thin film transistor TFT is disposed on the back plane 18, and the back plane 18 is disposed between the second sublayer 142 and the substrate 12.

With reference to the second aspect and the possible implementations, in another possible implementation, an anode is further disposed on the back plane 18.

With reference to the second aspect and the possible implementations, in another possible implementation, in the second part 102 of the OLED screen 10, the OLED screen 10 further includes a touch sensor 110.

With reference to the second aspect and the possible implementations, in another possible implementation, in the first part 101 of the OLED screen 10, the OLED screen 10 further includes a touch sensor 110.

With reference to the second aspect and the possible implementations, in another possible implementation, the OLED screen 10 further includes a cover 15, where the cover 15 is disposed on an upper layer of the encapsulation layer 11.

With reference to the second aspect and the possible implementations, in another possible implementation, in the second part 102 of the OLED screen 10, the OLED screen 10 further includes a polarizer 16, where the polarizer 16 is disposed between the encapsulation layer 11 and the cover 15.

With reference to the second aspect and the possible implementations, in another possible implementation, in the first part 101 of the OLED screen 10, the OLED screen 10 further includes a first clear colloid 17, where the first clear colloid 17 is configured to fill a gap between the encapsulation layer 11 and the cover 15.

With reference to the second aspect and the possible implementations, in another possible implementation, the first clear colloid 17 includes an optical clear resin OCR or an optical clear adhesive OCA.

With reference to the second aspect and the possible implementations, in another possible implementation, in the second part 102 of the OLED screen 10, the OLED screen 10 further includes a second clear colloid 120 and a third clear colloid 130.

The second clear colloid 120 is located between the polarizer 16 and the cover 15.

The third clear colloid 130 is located between the polarizer 16 and the encapsulation layer 11.

With reference to the second aspect and the possible implementations, in another possible implementation, in the first part 101 and the second part 102 of the OLED screen 10, the touch sensor 110 is integrated into the cover 15.

With reference to the second aspect and the possible implementations, in another possible implementation, in the second part 102 of the OLED screen 10, the touch sensor 110 is integrated into the polarizer 16.

With reference to the second aspect and the possible implementations, in another possible implementation, in the second part 102 of the OLED screen 10, the OLED screen 10 further includes at least one of a cushion layer 140 or a heat sink layer 150, where the heat sink layer 150 includes a metal sheet or a graphite sheet.

With reference to the second aspect and the possible implementations, in another possible implementation, the encapsulation layer 11 is an encapsulation glass layer or a thin film encapsulation layer.

For beneficial effects of the second aspect, refer to descriptions of related parts in the first aspect. Details are not described herein again.

DESCRIPTION OF EMBODIMENTS

For ease of understanding, descriptions of some concepts related to embodiments of this application are provided as examples for reference, as shown in the following:

Graphical user interface: It is a computer-operated graphical user interface displayed in a graphical manner.

Light sensor (light-sensor): Also referred to as a brightness sensor, it is typically located in an upper part of a device screen, and can automatically adjust brightness of the device screen based on current light brightness of a handheld device.

Distance sensor: It calculates a distance to an object by measuring a time interval from a time at which a light pulse is emitted to a time at which the light pulse is reflected by the object.

The following describes the technical solutions in the embodiments of this application with reference to the accompanying drawings in the embodiments of this application. In descriptions of the embodiments of this application, unless otherwise stated, "I" represents "or". For example, A/B may represent A or B, and "a plurality of" means two or more. Directions or positional relationships indicated by terms such as "center", "up", "down", "front", "back", "left", "right", "vertical", "horizontal", "top", "bottom", "inside", and "outside" are based on directions or positional relationships shown in the accompanying drawings, which are merely used for facilitating description of the embodiments of this application and for description simplicity, but do not indicate or imply that an indicated apparatus or element needs to have a specific orientation or needs to be constructed and operated in a specific orientation. Therefore, this cannot be understood as a limitation on the embodiments of this application.

An OLED screen in the embodiments of this application may have different classifications, for example, may include an active drive type (an active matrix OLED, AMOLED) and a passive drive type (a passive matrix OLED, PMOLED), and for another example, may include a rigid (rigid) OLED screen and a flexible OLED screen. The flexible OLED screen is bendable and has relatively high flexibility. The OLED screen may further include a one-piece touch display, for example, a Y-OCTA, or a non-one-piece touch display, for example, a YOUM. The Y-OCTA means a manner of directly integrating a touch sensor into a display panel in an OLED screen fabrication process; and the non-one-piece touch display means a manner of bonding a thin film type touch sensor onto a display panel of the OLED screen.

Figure 2A:
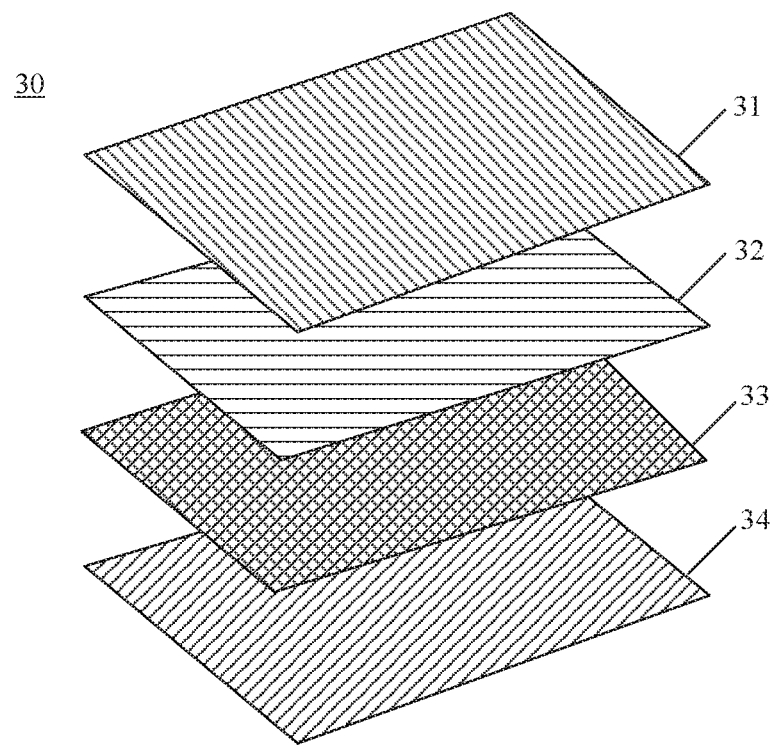
FIG. 2a is a schematic diagram of a layered structure of a screen according to an embodiment of this application.
Figure 2B:
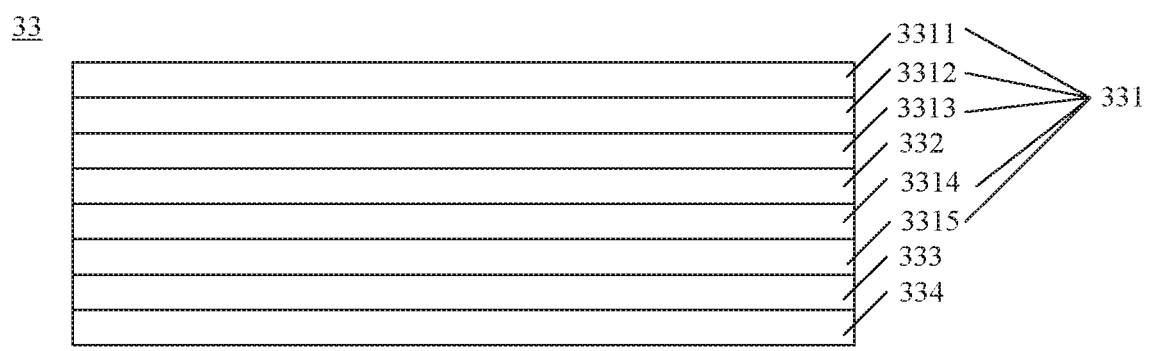
FIG. 2b is a schematic diagram of a layered structure of an organic self-luminance layer according to an embodiment of this application.
Figure 2C:
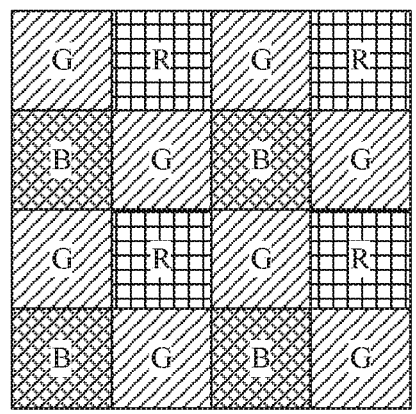
FIG. 2c is a schematic diagram of a light emitting layer according to an embodiment of this application.

An internal structure of the OLED screen is different from that of a conventional LCD screen. The inside of the LCD screen uses a structure including a backlight lamp and a light homogenizer plate, to provide a light source for brightness and display of the LCD screen. The OLED screen is usually made of a relatively thin organic light emitting material coating and a glass base board. When a current passes, an organic light emitting material may emit light. Therefore, compared with the LCD screen, the OLED screen may be thinner and provides a larger viewing angle, and power consumption of a terminal on which the OLED screen is disposed can be reduced. In addition, the OLED screen is generally a layered structure. For example, referring to a schematic diagram of a layered structure of an OLED screen shown in FIG. 2a, the OLED screen 30 may include a polarizer (polarizer) 31, an encapsulation layer 32, an organic self-luminance layer 33, and a substrate 34. The polarizer 31 may be configured to improve a contrast and reduce an impact on the contrast due to a reflection action of the OLED screen when external light is shone onto the OLED screen. The encapsulation layer 32 may be configured to protect the organic self-luminance layer 33, and has a high transmittance. The organic self-luminance layer 33 is mainly used for self-luminance of the OLED screen. The substrate 34 may be configured to carry the organic self-luminance layer 33 that is on an upper layer of the substrate 34. Specifically, referring to FIG. 2b, the organic self-luminance layer 33 may include a common layer 331, a light emitting layer 332, an anode (anode) 333, and a TFT layer 334. The common layer 331 is usually made of an organic material, and therefore may also be referred to as a common organic layer (common organic layer). The common layer 331 may specifically include a cathode (cathode) 3311, an electron injection layer (electron injection layer, EIL) 3312, an electron transfer layer (electron transfer layer, ETL) 3313, a hole transfer layer (hole transfer layer, HTL) 3314, and a hole injection layer (hole injection layer. HIL) 3315. The light emitting layer 332 may include red light emitting pixels (R), green light emitting pixels (G), and blue light emitting pixels (B). FIG. 2c is a schematic diagram of distribution of three types of light emitting pixels in the light emitting layer 332. The common layer 331 may be configured to cooperate with the anode 333 and the TFT layer 334 to drive the light emitting pixels in the light emitting layer 332 to emit light. It should be noted that the structures shown in FIG. 2a to FIG. 2c are merely example descriptions of the OLED screen. The OLED screen may alternatively have another structure. For example, an upper layer of the polarizer 31 may further include a cover or the like. The structure of the OLED screen is not specifically limited in the embodiments of this application.

Figure 1A:
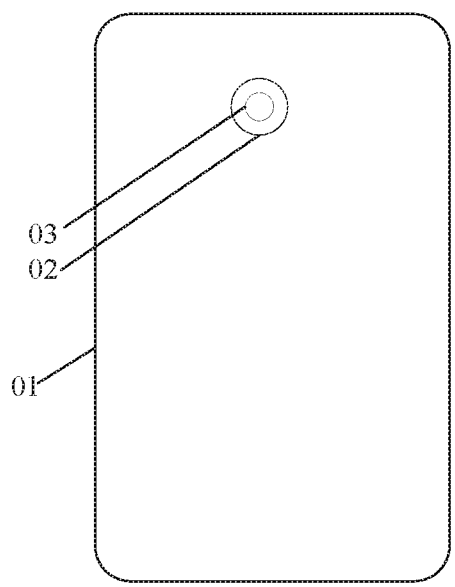
FIG. 1a is a top view of a screen according to the prior art.
Figure 1B:
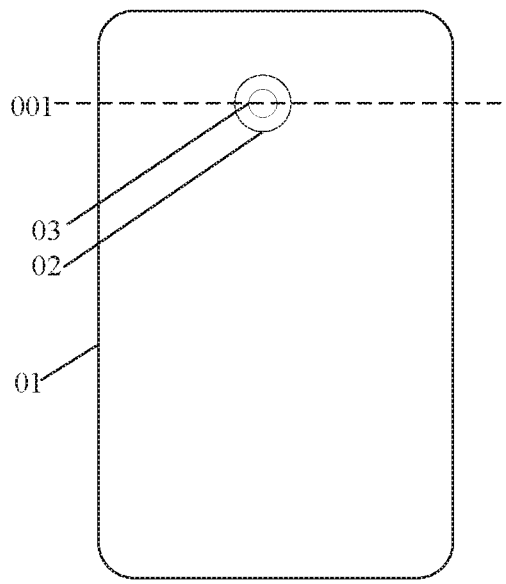
FIG. 1b is a schematic diagram of a section line according to the prior art.
Figure 1C:
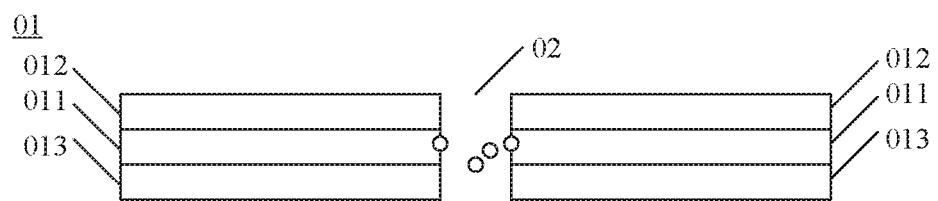
FIG. 1c is a sectional view of a screen according to the prior art.

In an existing drilling solution shown in FIG. 1c, at a small hole, harmful substances such as moisture in air are likely to enter the inside of an OLED screen through a common layer made of an organic material, and consequently, for example, light emitting pixels of the OLED screen become dark. According to the solutions provided in the embodiments of this application, harmful substances such as moisture in air can be prevented from entering the inside of the OLED screen. A main principle is as follows: The OLED screen includes a transparent first part, a camera may be disposed at a position that is below the OLED screen and that corresponds to the first part, and layers inside of the OLED screen are bonded to each other, thereby preventing harmful substances such as moisture in air from entering the inside of the OLED screen.

A terminal in the embodiments of this application is a terminal device including an OLED screen. For example, the terminal may be a device such as a mobile phone, a tablet, a notebook computer, an ultra-mobile personal computer (ultra-mobile personal computer, UMPC), a netbook, or a personal digital assistant (personal digital assistant, PDA).

Figure 3:
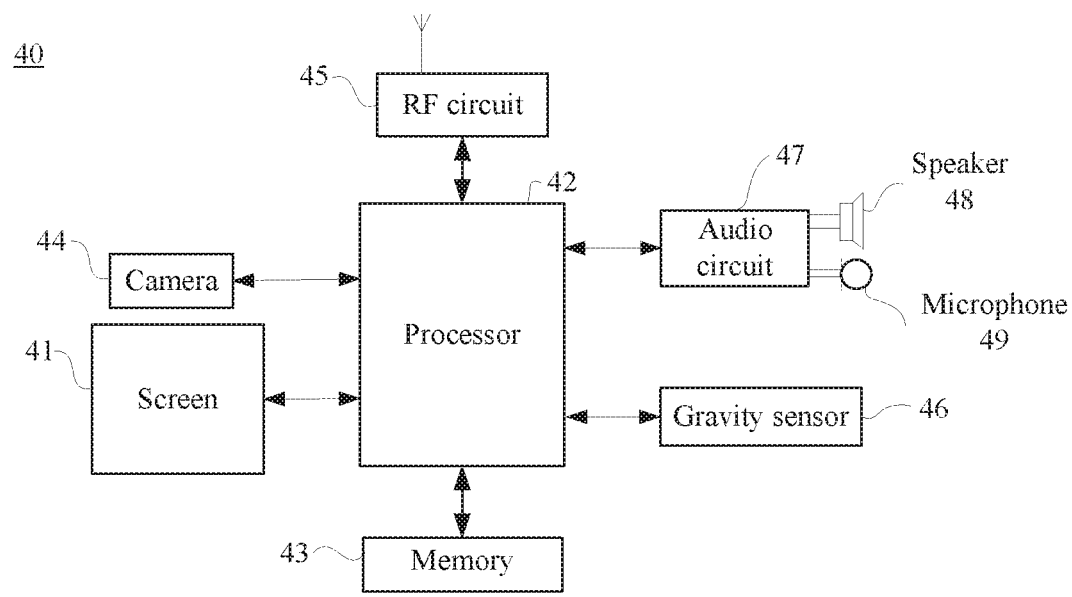
FIG. 3 is a schematic structural diagram of a mobile phone according to an embodiment of this application.

Specifically, in this embodiment of this application, a mobile phone is used as an example to describe the terminal provided in the embodiments of this application. As shown in FIG. 3, a mobile phone 40 may include components such as a screen 41, a processor 42, a memory 43, a camera 44, a radio frequency (radio frequency. RF) circuit 45, a gravity sensor 46, an audio circuit 47, a speaker 48, and a microphone 49. These components may be connected by using a bus, or may be connected directly. A person skilled in the art may understand that a structure of the mobile phone shown in FIG. 3 constitutes no limitation on the mobile phone, and the mobile phone may include more components than those shown in the figure, or a combination of some components, or components disposed differently.

The screen 41 may be a display panel or a touch display panel. Specifically, the screen 41 may be configured to display a graphical user interface, and may specifically be configured to display information input by a user or information, an image, various menus, and the like that are provided for the user. The screen 41 may be further configured to implement input and output functions of the mobile phone 40, may collect a touch operation, on or near the screen 41, by a user (for example, an operation, on the screen 41 or near the screen 41, by the user using any appropriate object or accessory such as a finger or a stylus), and may drive a corresponding connection apparatus based on a preset program. In addition, the screen 41 may further perform fingerprint detection.

The processor 42 is a control center of the mobile phone 40, and uses various interfaces and lines to connect parts of the entire mobile phone. By running or executing at least one of a software program and a module that are stored in the memory 43 and invoking data stored in the memory 43, the processor 42 executes various functions of the mobile phone 40 and processes data so as to perform overall monitoring on the mobile phone 40. During specific implementation, in an embodiment, the processor 42 may include one or more processing units, and an application processor and a modem processor may be integrated into the processor 42. The application processor mainly processes an operating system, a graphical user interface, an application, and the like, and the modem processor mainly processes wireless communication. It may be understood that the modem processor may not be integrated into the processor 42.

The memory 43 may be configured to store data, a software program, and a module, and may be a volatile memory (volatile memory), for example, a random access memory (random-access memory, RAM), or may be a non-volatile memory (non-volatile memory), for example, a read-only memory (read-only memory, ROM), a flash memory (flash memory), a hard disk drive (hard disk drive, HDD), or a solid state drive (solid-state drive, SSD), or a combination of the foregoing types of memories.

The camera 44 may be configured to shoot an image, including shooting a photo, recording a video, and the like.

The RF circuit 45 may be configured to receive or send a signal during an information receiving/sending process or a call process, and in particular, may send the received information to the processor 42 for processing, and send a signal generated by the processor 42 to the outside. Generally, the RF circuit includes but is not limited to an antenna, at least one amplifier, a transceiver, a coupler, a low noise amplifier (low noise amplifier, LNA), a duplexer, and the like. In addition, the RF circuit 45 may further communicate with a network and another device through wireless communication.

The gravity sensor (gravity sensor) 46 can detect acceleration magnitudes of the mobile phone in various directions (generally in three axes), and can detect a magnitude and a direction of gravity when the mobile phone is static, and can be used for mobile phone posture recognition applications (for example, switching between landscape and portrait screens, a related game, and magnetometer posture calibration), vibration recognition-related functions (such as a pedometer or knocking), and the like. It should be noted that the mobile phone 40 may further include other sensors such as a pressure sensor, a light sensor, a gyroscope, a barometer, a hygrometer, a thermometer, and an infrared sensor. Details are not described herein.

The audio circuit 47, the speaker 48, and the microphone 49 may provide an audio interface between the user and the mobile phone 40. The audio circuit 47 may transmit, to the loudspeaker 48, an electric signal converted from received audio data, and the loudspeaker 48 converts the electric signal into a sound signal for outputting. In addition, the microphone 49 converts a collected sound signal into an electric signal, and the audio circuit 47 receives the electric signal and converts the electric signal into audio data, and then outputs the audio data to the RF circuit 45 to send the audio data to, for example, another mobile phone, or outputs the audio data to the processor 42 for further processing.

Although not shown, function modules such as a wireless fidelity (wireless fidelity, Wi-Fi) module, a bluetooth module, a global positioning system (global positioning system, GPS) navigation module, and a camera may be further included in the mobile phone 40. Details are not described herein.

Specifically, a terminal 20 and an OLED screen 10 provided in an embodiment of this application are described in detail below with reference to the mobile phone 40 shown in FIG. 3. It should be noted that the terminal 20 provided in this embodiment of this application may alternatively be any terminal device other than the mobile phone 40 shown in FIG. 3.

Figure 4A:
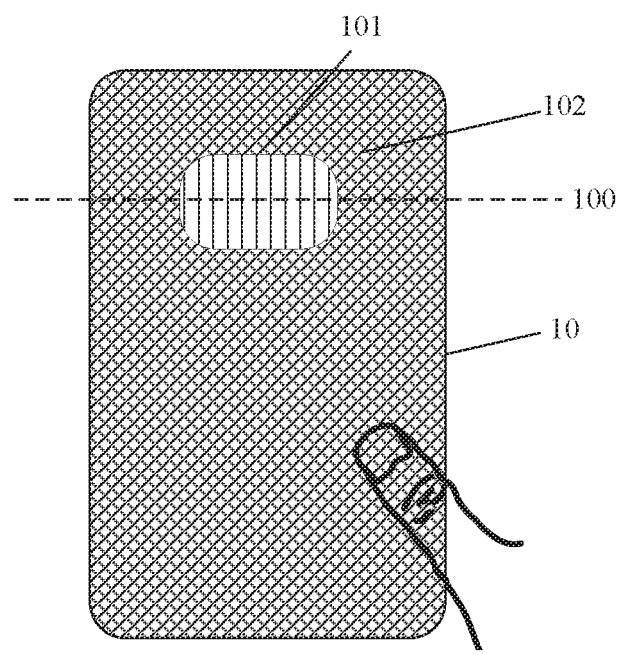
FIG. 4a is a top view of a screen according to an embodiment of this application.
Figure 4B:
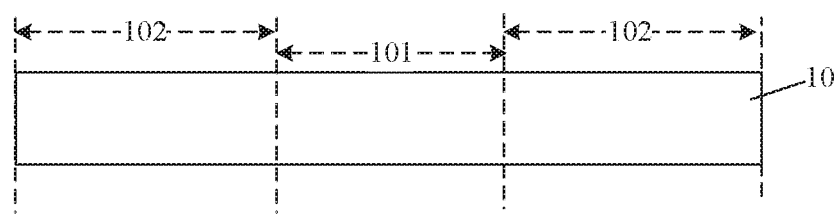
FIG. 4b is a sectional view of a screen according to an embodiment of this application.

Referring to FIG. 4a, the OLED screen 10 provided in this embodiment of this application may include a first part 101 (the part filled with vertical lines in FIG. 4a) and a second part 102 (the part filled with grids in FIG. 4a). In other words, the OLED screen 10 may be divided into two parts: the first part 101 and the second part 102. For a correspondence between the first part 101, the second part 102, and the OLED screen 10, refer to a sectional view 4b of the OLED screen 10 obtained based on a section line 100 shown in FIG. 4a. It is worth noting that in the following embodiments of this application, unless otherwise stated, all sectional views of the OLED screen 10 are obtained based on the section line 100 shown in FIG. 4a.

Figure 5:
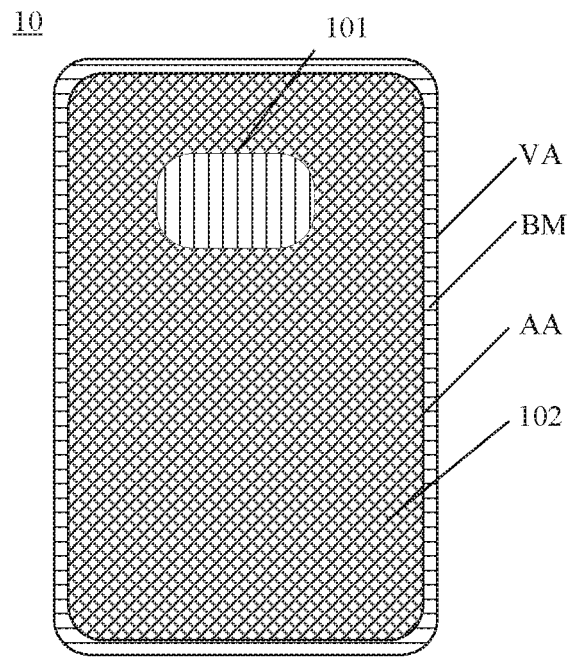
FIG. 5 is a top view of another screen according to an embodiment of this application.

Specifically, referring to FIG. 5, the OLED screen 10 may include a view area (view area. VA), the VA area may include an AA area, and a periphery of the AA area may further include a black matrix (black matrix, BM) area (the part filled with horizontal lines in FIG. 5). The OLED screen 10 includes the first part 101 and the second part 102, which may specifically mean that the OLED screen 10 at a position corresponding to the AA area may include the first part 101 and the second part 102.

Figure 6:
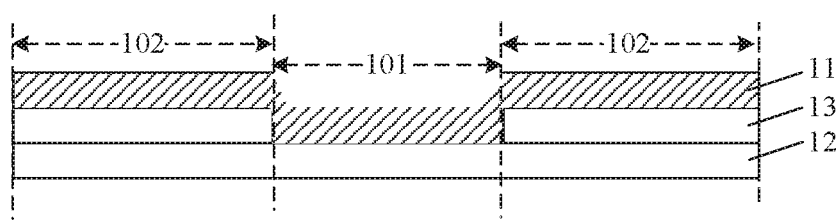
FIG. 6 is a sectional view of another screen according to an embodiment of this application.

Referring to FIG. 6, the OLED screen 10 provided in this embodiment of this application may include an encapsulation layer 11 and a substrate 12. In addition, the OLED screen 10 may include the first part 101 and the second part 102. In the first part 101 of the OLED screen 10, the encapsulation layer 11 is bonded to the substrate 12. In the second part 102 of the OLED screen 10, the OLED screen 10 may further include a light emitting layer 13, where the light emitting layer 13 is disposed between the encapsulation layer 11 and the substrate 12, and the light emitting layer 13 may specifically include red light emitting pixels, green light emitting pixels, and blue light emitting pixels.

The part filled with leftward oblique lines in FIG. 6 indicates the encapsulation layer 11 and may correspond to the encapsulation layer 32 in FIG. 2a; the substrate 12 in FIG. 6 may correspond to the substrate 34 in FIG. 2a; and the light emitting layer 13 in FIG. 6 may correspond to the light emitting layer 332 in FIG. 2b and FIG. 2c.

Specifically, the light emitting layer 13 may include an organic light emitting material such as an organic semiconductor, and may be used for self-luminance of the OLED screen 10. Because the second part 102 of the OLED screen 10 includes the light emitting layer 13, the second part 102 of the OLED screen 10 may be configured to display a graphical user interface by controlling the self-luminance of the light emitting layer 13. To display the graphical user interface herein may include: displaying information, an image, and various menus provided for a user by the OLED screen 10, and obtaining and displaying information and the like input by the user. Because the first part 101 of the OLED screen 10 does not include the light emitting layer 13, the first part 101 of the OLED screen 10 cannot perform self-luminance, and therefore cannot be configured to display the graphical user interface.

In addition, in the second part 102 of the OLED screen 10, the encapsulation layer 11 and the light emitting layer 13 are bonded to each other, and the light emitting layer 13 and the substrate 12 are bonded to each other. The encapsulation layer 11 and the substrate 12 may be configured to isolate the light emitting layer 13 from an external environment to prevent external force damage and intrusion of harmful substances from air outside, such as moisture, harmful gases (for example, oxygen), dust and rays, so as to stabilize various parameters of a device in the light emitting layer 13, improve performance of the OLED screen 10, and prolong a service life of the OLED screen 10. The substrate 12 may be further configured to carry a thin film layer disposed on an upper layer of the substrate 12, for example, carry a light emitting layer 13 having a thin film layer structure.

In the first part 101 of the OLED screen 10, the encapsulation layer 11 and the substrate 12 are configured to be bonded to each other. It should be noted that although compared with the second part 102 of the OLED screen 10, in the first part 101 of the OLED screen 10, the light emitting layer 13 is not included inside the OLED screen 10, because the encapsulation layer 11 and the substrate 12 are tightly bonded, no gap is left at the position that is between the encapsulation layer 11 and the substrate 12 and that is in the first part 101 of the OLED screen 10. Therefore, this is different from the prior art in which harmful substances such as moisture in air enter the inside of the OLED screen and therefore performance of the OLED screen 10 is affected.

Therefore, in the first part 101 and the second part 102 of the OLED screen 10, layers inside the OLED screen 10 are tightly bonded. As a result, harmful substances such as moisture in air can be prevented from entering the inside of the OLED screen 10.

In addition, in this embodiment of this application a transmittance of the first part 101 of the OLED screen 10 is greater than or equal to a preset value. In other words, first part 101 of the OLED screen 10 is transparent. Specifically, the encapsulation layer 11 and the substrate 12 that are included in the OLED screen 10 have relatively high transmittances, and the encapsulation layer 11 and the substrate 12 may be transparent. Therefore, the first part 101, formed by stacking the encapsulation layer 11 and the substrate 12, of the OLED screen 10 is also transparent. The preset value herein may be set according to an actual requirement. In this embodiment of this application, the OLED screen 10 corresponding to the first part 101 may also be referred to as a transparent window. In this way, when a device is disposed at a position that is below the OLED screen 10 and that corresponds to the first part 101, the transparent window does not affect incidence and emission of light for the device. Therefore, an optical device sensitive to light can be disposed below the transparent window.

In addition, the encapsulation layer 11 and the substrate 12 that have relatively high transmittances can also enable the light emitting layer 13 to display, in the second part 102 of the OLED screen 10, the graphical user interface through the encapsulation layer 11.

Figure 7:
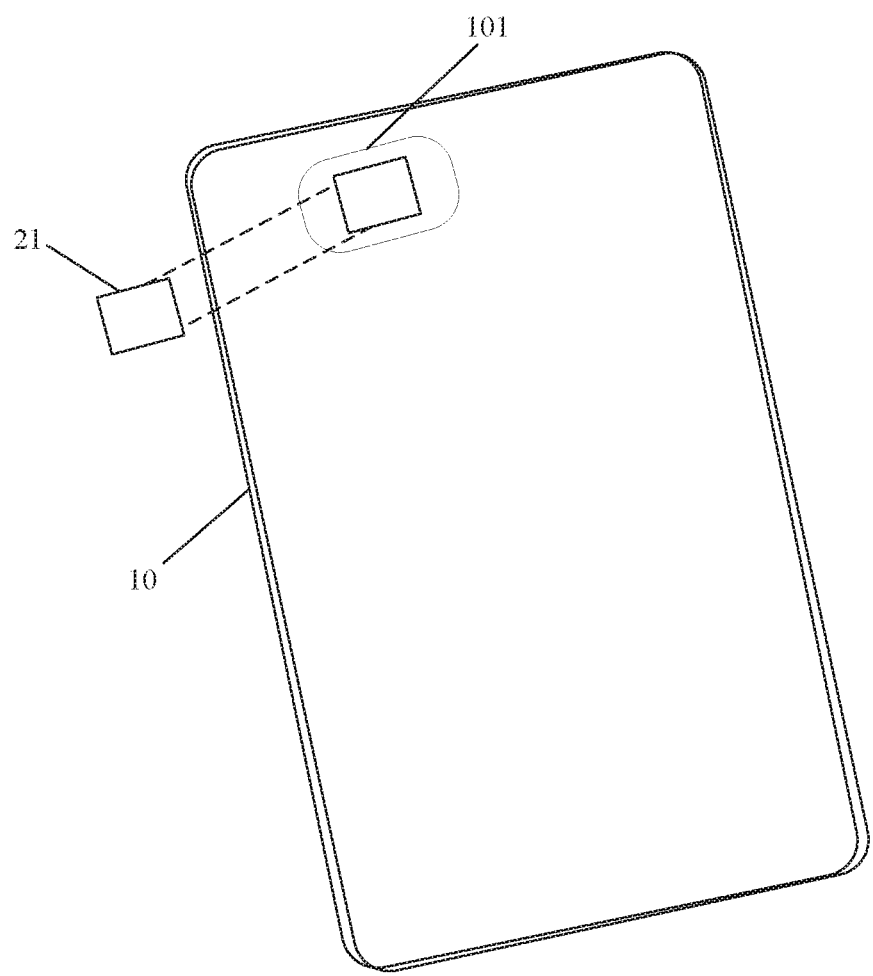
FIG. 7 is a diagram of a correspondence between an optical device and a first part according to an embodiment of this application.

In this embodiment of this application, referring to FIG. 7, the position that is below the OLED screen 10 and that corresponds to the first part 101 is used to dispose an optical device 21. In other words, the optical device 21 may be disposed below the transparent window. The optical device herein is usually a device that is disposed on a front panel of the terminal 20 and that performs light interaction with the outside, and for example, may specifically be at least one of a camera, an indicator lamp, a light sensor, a distance sensor, or the like. When the optical device such as the camera, the indicator lamp, the light sensor, or the distance sensor is disposed below the transparent window, the transparent window does not affect incidence and emission of light for the optical device such as the camera, the indicator lamp, the light sensor, or the distance sensor, and the optical device can work normally. In addition, the optical device disposed below the transparent window can be seen through the transparent window, and the optical device can also perform light prompting to the outside of the OLED screen 10 through the transparent window.

In addition, it can be learned, through comparison between FIG. 1c and FIG. 6, that in an existing drilling solution, an OLED screen 01 is discontinuous, but the OLED screen 10 provided in this embodiment of this application is a contiguous entirety.

Figure 8:
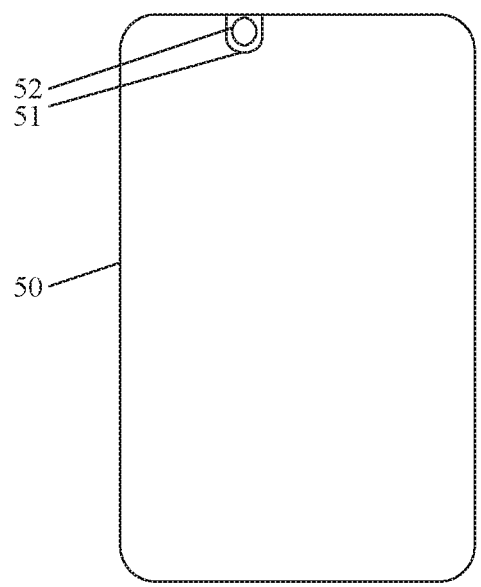
FIG. 8 is a top view of another screen according to the prior art.

In addition, there is also a notch solution in the prior art, which is used to dispose a camera on a front panel of a mobile phone. Referring to FIG. 8, the notch solution means setting a notch 51 in an edge region at the top of a screen 50 of a mobile phone, and disposing a camera 52 inside the notch 51. In such notch solution, because the camera is disposed inside the notch of the screen, and due to reasons of wiring and the like, the notch can be set only in an edge region of the screen, and the camera can also be disposed only in the edge region of the screen.

Figure 9A:
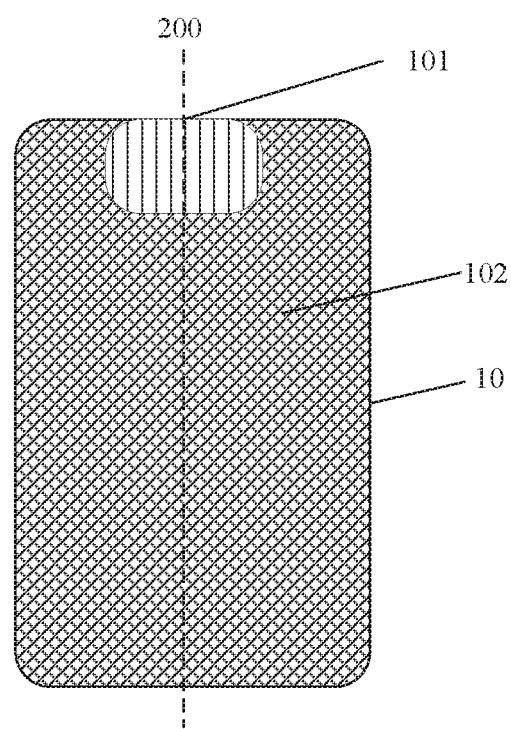
FIG. 9a is a top view of another screen according to an embodiment of this application.
Figure 9B:
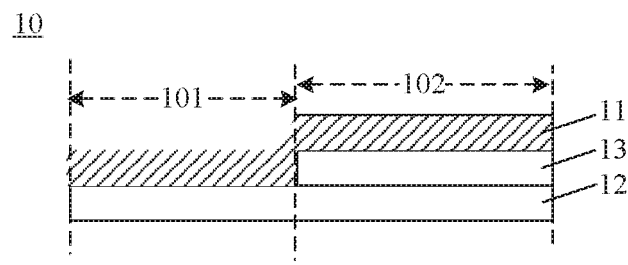
FIG. 9b is a sectional view of another screen according to an embodiment of this application.

In this embodiment of this application, the first part 101 may be located at any position of the OLED screen 10. For example, as shown in FIG. 4a, the first part 101 may be located in a central region of the OLED screen 10. Alternatively, referring to a top view of the OLED screen 10 shown in FIG. 9a and a sectional view 9b of the OLED screen 10 obtained based on a section line in FIG. 9a, the first part 101 may be located in an edge region of the OLED screen. In this way, corresponding to a position of the first part 101, an optical device such as a camera may be disposed at any position of the OLED screen, which is different from an existing notch solution in which the optical device can be disposed only in an edge region of the OLED screen 10 by using a notch.

In addition, because in the existing notch solution, the notch can be disposed only in the edge region of the screen, even if the optical device does not need to be disposed at the edge position of the screen, the notch needs to be connected to the edge region, thereby occupying a larger screen area. In the OLED screen 10 provided in this embodiment of this application, the optical device and the first part 101 can be disposed at any position of the OLED screen 10 according to an actual requirement without needing to be connected to the edge region. Therefore, a smaller area is occupied and a display ratio of the OLED screen 10 is higher.

In addition, the first part 101 may include a contiguous small region, and a position corresponding to the contiguous small region may be used to dispose one or more optical devices; or the first part 101 may include a plurality of discontiguous small regions, and positions corresponding to the different small regions may be used to dispose different optical devices, respectively. In this embodiment of this application, a shape of the first part 101 is not specifically limited. For example, a shape of each small region in the first part 101 may be a circle, a rectangle, a rounded rectangle, an irregular shape, or the like.

It should be noted that in this embodiment of this application, two regions (or positions) that "correspond" to each other mean that the two regions (or positions) are completely or mostly overlapped.

Particularly, a size of the transparent window (namely, the first part 101) may be the same as a size of the optical device or may be the same as a size of a region in which the optical device collects light. In this way, light collection of the optical device is not affected, and the area of the first part 101 may be reduced as much as possible to increase the area of the second part 102, thereby increasing the display ratio of the OLED screen 10.

Figure 10:
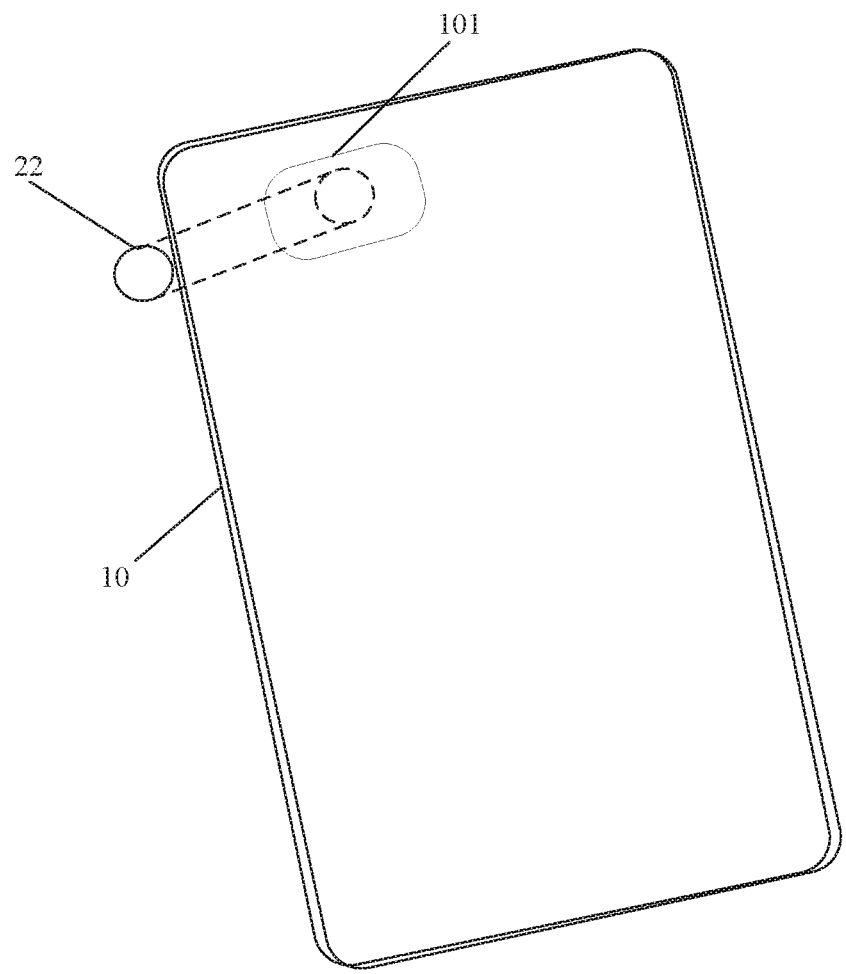
FIG. 10 is a diagram of a correspondence between a camera and a first part according to an embodiment of this application.

For example, referring to FIG. 10, the first part 101 includes a contiguous small region, and a position that is below the OLED screen 10 and that corresponds to the contiguous small region is used to dispose a camera 22. When the camera 22 is disposed at the position that is below the OLED screen 10 and that corresponds to the first part 101, the transparent window does not affect light incidence for the camera 22. Therefore, the camera 22 can normally shoot an image, and the camera 22 below the OLED screen 10 can be seen through the transparent window. Particularly, a size of the transparent window may be the same as a size of a region in which the camera 22 collects light.

Figure 11:
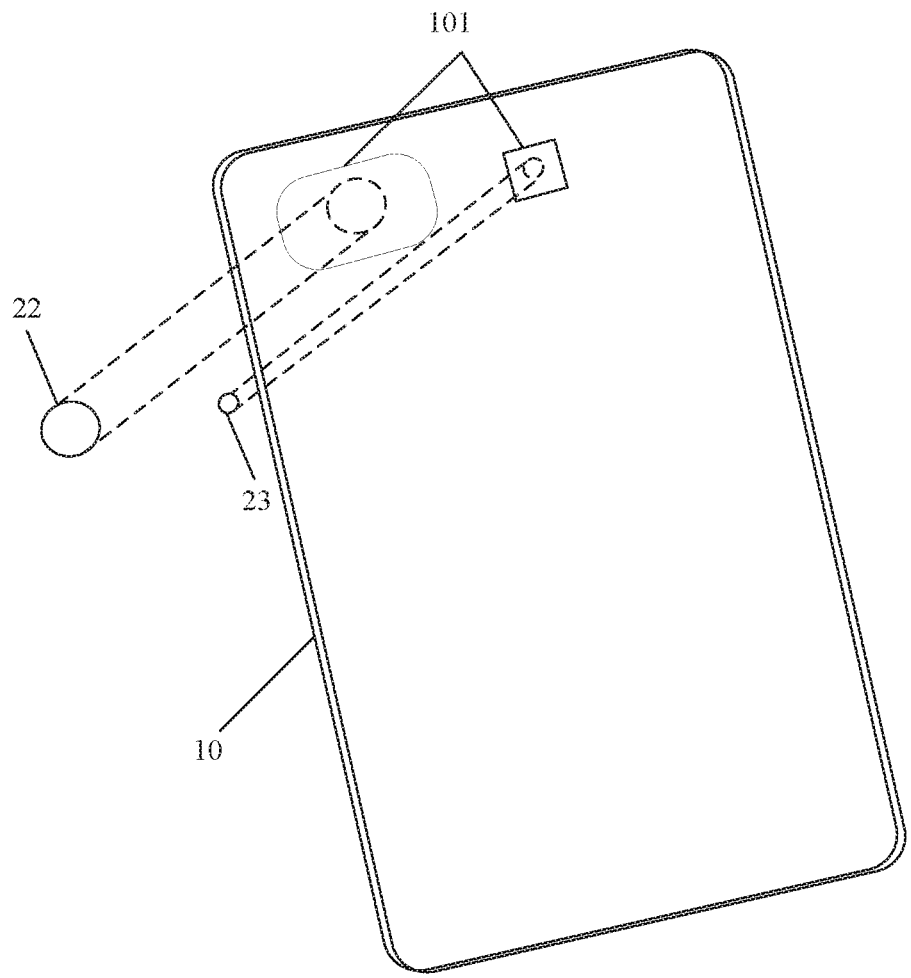
FIG. 11 is a diagram of a correspondence between a camera, an indicator lamp, and a first part according to an embodiment of this application.

For example, referring to FIG. 11, the first part 101 includes two discontiguous small regions, and positions that are below the OLED screen 10 and that correspond to the two small regions are used to dispose a camera 22 and an indicator lamp 23. When the indicator lamp 23 is disposed below the transparent window, the transparent window does not obstruct emission of light from the indicator lamp 23 to the outside, so that the indicator lamp 23 can perform light prompting to the outside.

In addition, a characteristic of the encapsulation layer 11 varies with a type of the OLED screen. For example, a rigid material may be used for an encapsulation layer 11 in a rigid OLED screen, and a flexible material may be used for an encapsulation layer 11 in a flexible OLED screen. For example, the encapsulation layer 11 in the rigid OLED screen may specifically be an encapsulation glass layer having a relatively large thickness, or the encapsulation layer 11 may be an encapsulation metal plate having a relatively large thickness. For example, the encapsulation layer 11 in the flexible OLED screen may specifically be a thin film encapsulation (TFE) layer, for example, a polymer thin film encapsulation layer; or the encapsulation layer 11 may be obtained by covering a single-layer inorganic thin film or a multi-layer organic or inorganic thin film encapsulation layer on a polymer; or the encapsulation layer 11 may be a metal sheet: or the encapsulation layer 11 may be an ultra-thin (with a thickness less than 50 µm) glass sheet or the like. The metal sheet whose thickness is very small and the ultra-thin glass sheet have relatively high flexibility. The polymer herein may be a material such as polyimide resin (PI), polyethylene terephthalate (PET), polyethylene naphthalate (PEN), polyethylene (PE), polypropylene (PP), or polystyrene (PS).

Similar to the material used for the encapsulation layer 11, the substrate 12 in the OLED screen 10 may also be a glass base board, a polymer thin film base board, or the like. For example, a substrate 12 in a flexible OLED screen may specifically be a polyimide resin (PI) base board in the polymer thin film base board.

In addition, in some implementations, the substrate 12 in the OLED screen 10 may have a particular color. For example, when the substrate 12 is a polyimide resin (PI) base board, the substrate 12 may have a color of primrose yellow, but the primrose yellow does not affect high transmittance of the substrate 12. In other words, the substrate 12 does not affect a transparent characteristic of the first part 101. When the first part 101 is configured to cover the camera 22, the color of the substrate 12 may, to some degree, have a particular impact on an image shot by the camera 22. In this case, a terminal may eliminate, in another manner, the impact caused by the color of the PI substrate on the image shot by the camera.

In another implementation, the OLED screen 10 can use a colorless transparent substrate 12, for example, a transparent polyimide PI resin base board or a glass base board. In this way, in terms of color, the colorless transparent substrate 12 does not affect the image shot by the camera 22.

Figure 12:
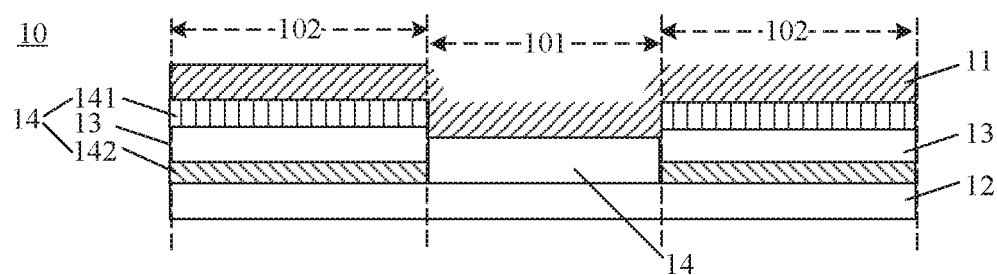
FIG. 12 is a sectional view of another screen according to an embodiment of this application.

Further, referring to a sectional view of the OLED screen 10 shown in FIG. 12, the OLED screen 10 provided in this embodiment of this application may further include a common layer 14 disposed between the encapsulation layer 11 and the substrate 12, where the encapsulation layer 11 and the substrate 12 may be configured to isolate the common layer 14 from air, and the common layer 14 may include at least one of a hole layer or an electron layer. In the second part 102 of the OLED screen 10, the common layer 14 may include a first sublayer 141 (the part filled with vertical lines in FIG. 12) and a second sublayer 142 (the part filled with rightward oblique lines in FIG. 12), and the light emitting layer 13 may be located between the first sublayer 141 and the second sublayer 142. In other words, the common layer 14 may be disposed in the entire OLED screen 10, including the first part 101 of the OLED screen 10 and the second part 102 of the OLED screen 10. In addition, in the first part 101 of the OLED screen 10, the common layer 14 is bonded to the substrate 12, and the encapsulation layer 11 is bonded to the common layer 14.

The common layer 14 is disposed corresponding to a region covered by the encapsulation layer 11 and the substrate 12. The common layer 14 is generally made of an organic material and may be configured to drive, through hole or electron movement, light emitting pixels in the light emitting layer 13 to emit light. In addition, generally, a transmittance of the common layer 14 is relatively high, so that a transmittance of the first part 101 of the OLED screen 10 that includes the common layer 14 is greater than or equal to a preset value, and the first part 101 of the OLED screen 10 is transparent.

In the second part 102 of the OLED screen 10, the common layer 14 may include two parts: the first sublayer 141 and the second sublayer 142. The light emitting layer 13 may be disposed between the first sublayer 141 and the second sublayer 142, and the first sublayer 141 and the second sublayer 142 cooperate to drive the light emitting pixels in the light emitting layer 13 to emit light. Because the first part 101 of the OLED screen 10 does not include the light emitting layer 13, it can be understood that the common layer 14 includes two sublayers: the first sublayer 141 and the second sublayer 142, or it can be understood that the common layer 14 is a whole layer.

In a structure shown in FIG. 12, although compared with the second part 102, the inside of the first part 101 of the OLED screen 10 lacks the light emitting layer 13, because the encapsulation layer 11, the common layer 14, and the substrate 12 are tightly bonded, no gap is left between the encapsulation layer 11, the common layer 14, and the substrate 12, and the encapsulation layer 11 and the substrate 12 may isolate the common layer 14 from outside air to prevent the common layer 14 from being in direct contact with air. Therefore, the following, as caused by a drilling solution in the prior art, can be avoided: Harmful substances such as moisture enter the inside of the OLED screen through the common layer to affect performance of the OLED screen.

Specifically, in this embodiment of this application, the common layer 14 may specifically include a plurality of layers, and may also include a plurality of specific structures. For example, in one case, the common layer 14 may correspond to the common layer 331 in FIG. 2a and FIG. 2b, and therefore includes a cathode, a capping layer, an electron injection layer, an electron transfer layer, a hole transfer layer, and a hole injection layer. In another case, the common layer 14 may further include a capping layer (capping layer. CPL), the first sublayer 141 may include a cathode, the capping layer, an electron injection layer, and an electron transfer layer, the second sublayer 142 may include a hole transfer layer and a hole injection layer, and the second sublayer 142 is located below the first sublayer 141. The structure of the common layer 14 is not specifically limited in this embodiment of this application.

Figure 13:
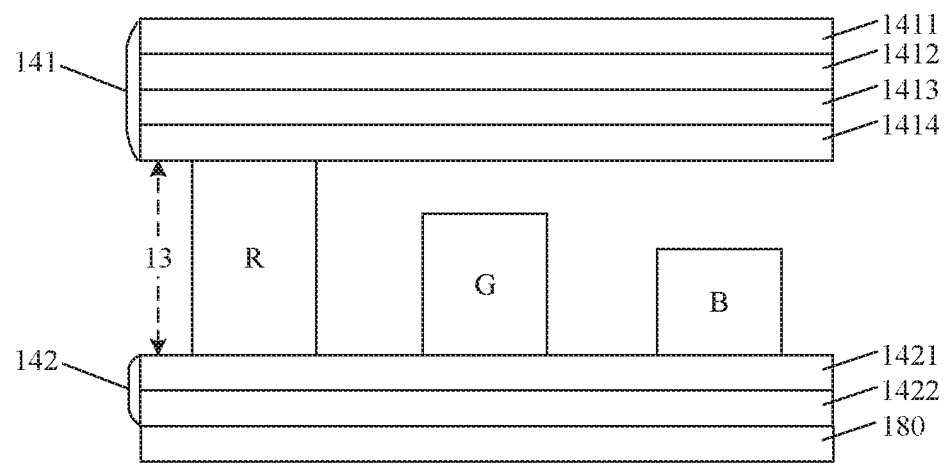
FIG. 13 is a sectional view of another screen according to an embodiment of this application.

For example, FIG. 13 is a sectional view of an OLED screen 10 having a micro cavity structure. The OLED screen 10 may include a common layer 14, a light emitting layer 13, and an anode anode 180, where the anode 180 may correspond to the anode 333 in FIG. 2b. The OLED screen having the micro cavity structure is an OLED screen having a microresonator, and may include the following three features: having a cathode and an anode that are parallel and reflective, for example, a cathode 1411 and the anode 180 in FIG. 14; having a resonant cavity between the cathode and the anode, namely, a stacked organic layer between the cathode and the anode, for example, an electron injection layer 1413 and an electron transfer layer 1414 as well as a hole transfer layer 1421 and a hole injection layer 1422 that are stacked in FIG. 14; and having an internal light emitting source, for example, three types of light emitting pixels R, G and B in FIG. 14. It can be learned from FIG. 14 that the three types of light emitting pixels R, G and B have different heights, where the heights herein are used to indicate wavelengths of the light emitting pixels. In the OLED screen having the micro cavity structure, a particular light intensity (intensity) can be formed only when a wavelength of a light emitting pixel reaches a particular value, and a relatively good light emitting effect of the light emitting pixel can be ensured only when the light intensity reaches a particular value. Generally, when a wavelength of B is greater than or equal to 430 nm, a wavelength of R is greater than or equal to 630 nm, and a wavelength of G is between 430 nm and 630 nm, light intensities respectively corresponding to the three types of light emitting pixels can satisfy a light emitting requirement.

In FIG. 13, in the second part 102 of the OLED screen 10, the common layer 14 in the OLED screen 10 may include a first sublayer 141 and a second sublayer 142, where the first sublayer 141 is located above the light emitting layer 13, the second sublayer 142 is located below the light emitting layer 13, the first sublayer 141 may include the cathode 1411, a capping layer 1412, the electron injection layer 1413 and the electron transfer layer 1414, and the second sublayer 142 includes the hole transfer layer 1421 and the hole injection layer 1422. In the first part 101 of the OLED screen 10, the common layer 14 in the OLED screen 10 may be considered as a whole layer or may be considered to include the first sublayer 141 and the second sublayer 142, where the first sublayer 141 and the second sublayer 142 are disposed adjacent to each other.

In addition, in another division manner, a combination of the light emitting layer 13 and the common layer 14 in FIG. 13 may be referred to as an organic self-luminance layer. In another division manner, a combination of the light emitting layer 13, the common layer 14, and the anode 180 in FIG. 13 may correspond to the organic self-luminance layer 33 in FIG. 2a.

Figure 14:
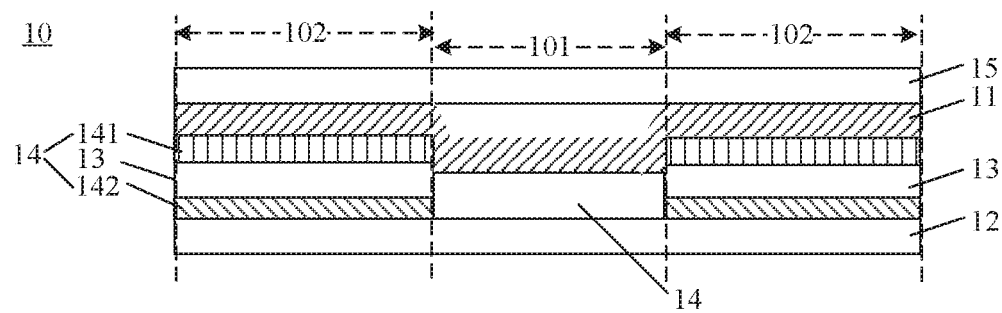
FIG. 14 is a sectional view of another screen according to an embodiment of this application.

Further, referring to FIG. 14, in this embodiment of this application, the OLED screen 10 may further include a cover 15, where the cover 15 is disposed on an upper layer of an encapsulation layer 11. In other words, in the first part 101 of the OLED screen 10 and the second part 102 of the OLED screen 10, the cover 15 may be disposed on the upper layer of the encapsulation layer 11. The cover 15 may be configured to protect components inside the OLED screen 10, and may specifically be a glass cover (cover glass) 15, a transparent plastic cover 15, a composite cover 15, or the like. The glass cover 15 may include a cover 15 made of an anisotropic material, such as a sapphire glass cover 15, or may include a cover 15 fabricated by cladding a layer of anisotropic material on a glass base board by using a chemical vapor deposition (chemical vapor deposition, CVD) or physical vapor deposition (physical vapor deposition, PVD) technology. The composite cover 15 may be a cover 15 composited by using a plurality of materials, for example, a cover 15 composited by using plastic and glass.

Figure 15:
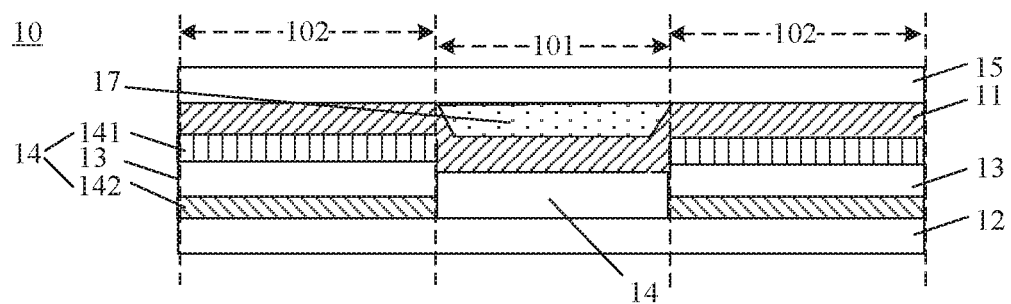
FIG. 15 is a sectional view of another screen according to an embodiment of this application.

Further, referring to FIG. 15, in this embodiment of this application, in the first part 101 of the OLED screen 10, the OLED screen 10 may further include a first clear colloid 17 (the part filled with dots in FIG. 15), where the first clear colloid 17 is configured to fill a gap between the encapsulation layer 11 and the cover 15.

Because the first clear colloid 17 is transparent, a transparent characteristic of the first part 101 of the OLED screen 10 is not affected. In addition, the gap between the encapsulation layer 11 and the cover 15 is filled with the first clear colloid 17, so that the cover 15 and the encapsulation layer 11 are bonded to each other. Therefore, the OLED screen 10 is firmer, and air in the gap can be further exhausted, preventing the air in the gap from affecting performance of devices in the OLED screen 10, and improving reliability of the OLED screen 10.

Specifically, the first clear colloid 17 herein may be an optical clear resin OCR or an optical clear adhesive OCA. The OCA is a macromolecular substance providing excellent bonding performance and providing optical performance similar to that of an optical part, and can glue optical parts into an optical component that can meet an optical path design requirement. The OCR may also be referred to as optical liquid adhesive or water-based adhesive, and is a liquid at normal atmospheric temperature. When the first clear colloid 17 is the OCR, the gap between the encapsulation layer 11 and the cover 15 can be more sufficiently filled with the liquid OCR, so that the cover 15 and the encapsulation layer 11 can be tightly bonded. In addition, light scattering caused by external light, backlight, and the like can be suppressed, improving a contrast of the OLED screen 10.

Figure 16:
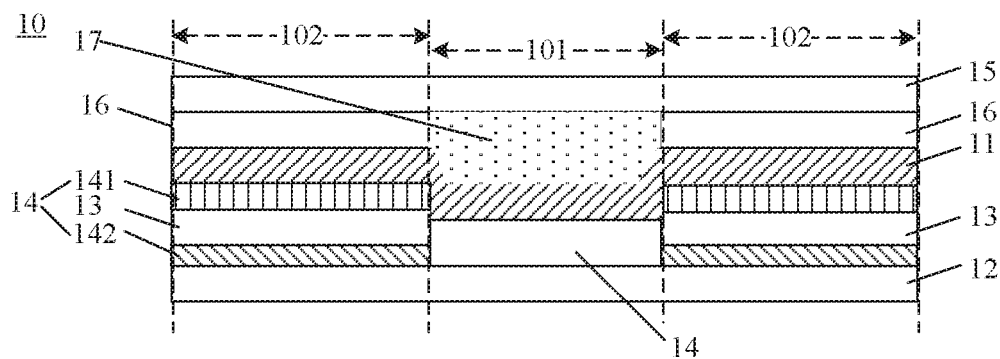
FIG. 16 is a sectional view of another screen according to an embodiment of this application.

Further, referring to FIG. 16, in this embodiment of this application, in the second part 102 of the OLED screen 10, the OLED screen 10 may further include a polarizer 16, where the polarizer 16 may be disposed between the encapsulation layer 11 and the cover 15. The polarizer may correspond to the polarizer 31 in FIG. 2a.

When external light is shone onto the OLED screen 10, because the external light may be reflected by a reflection layer, for example, metal in the OLED screen 10, a display contrast of the OLED screen 10 may be affected. Arrangement of the polarizer 16 may be used to reduce external light incident to the OLED screen 10, improve the display contrast of the OLED screen 10, and improve display quality of the second part 102, so that a user can clearly see a graphical user interface displayed on the OLED screen 10 when ambient light is very bright. For example, the polarizer 16 herein may be a circular polarizer 16, and may specifically be an anti-reflective sheet obtained by combining a ¼ wavelength phase film and a common polarizer.

In this embodiment of this application, unlike the second part 102, in the first part 101 of the OLED screen 10, the OLED screen 10 does not include the polarizer 16. Because the polarizer may affect incidence of external light, when the OLED screen 10 directly under the first part 101 includes a polarizer, normal operation of an optical device 21 below the transparent window may be affected.

Figure 17:
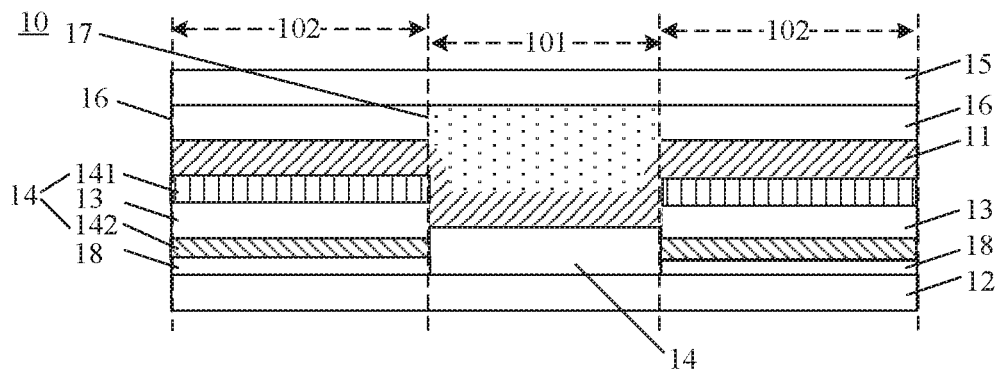
FIG. 17 is a sectional view of another screen according to an embodiment of this application.

Further, referring to FIG. 17, in this embodiment of this application, in the second part 102 of the OLED screen 10, the OLED screen 10 may further include a back plane (back plane) 18, where a thin film transistor TFT is disposed on the back plane 18, and the back plane 18 is disposed between the second sublayer 142 and a substrate 12. In addition, the anode 180 may be further disposed on the back plane 18, and the TFT and the anode 180 may be configured to cooperate with the common layer 14 to drive the light emitting pixels in the light emitting layer 13 to emit light. The back plane including the TFT and the anode 180 shown in FIG. 17 may correspond to the anode 333 and the TFT layer 334 in FIG. 2c.

When the OLED screen 10 includes the back plane 18, in a division manner, a combination of the light emitting layer 13, the common layer 14, and the back plane 18 may correspond to the organic self-luminance layer 33 in FIG. 2a and FIG. 2b.

Figure 18:
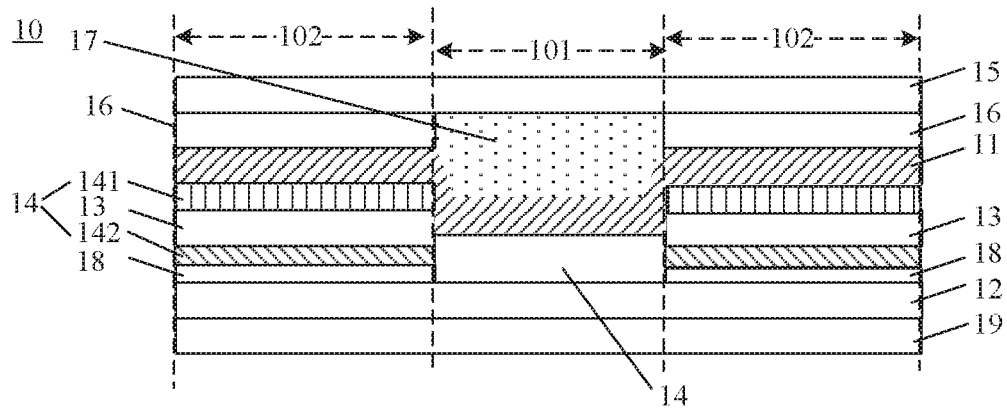
FIG. 18 is a sectional view of another screen according to an embodiment of this application.

Furthermore, referring to FIG. 18, the OLED screen 10 may further include a rear film (rear film) 19 disposed below the substrate 12, where the rear film 19 is configured to reinforce the substrate 12.

Because generally the substrate 12 is relatively thin, and a wrinkle, a fracture, or the like is likely to occur, the rear film 19, similar to a reinforcement plate, can reinforce the substrate 12.

In addition, it should be noted that, the OLED screen 10 provided in this embodiment of this application may specifically be a touchscreen. To be specific, a touch sensor (touch sensor) 110 may be further disposed in the OLED screen 10. Specifically, in a possible implementation, in the second part 102 of the OLED screen 10, the OLED screen 10 further includes a touch sensor 110, but in the first part 101 of the OLED screen 10, no touch sensor is disposed in the OLED screen 10. In another possible implementation, in both the first part 101 and the second part 102 of the OLED screen 10, touch sensors 110 are disposed in the OLED screen 10. There may specifically be a plurality of manners of disposing the touch sensor 110, for example, an oncell manner, an undercell manner, an incell manner, or an OGS manner.

Figure 19:
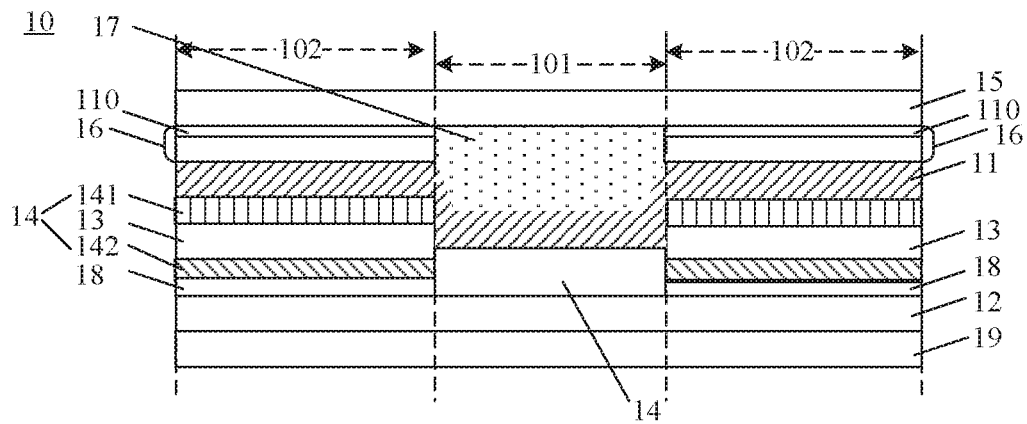
FIG. 19 is a sectional view of another screen according to an embodiment of this application.

For example, referring to FIG. 19, in the oncell manner, in the second part 102 of the OLED screen 10, the touch sensor 110 is integrated into the polarizer 16. In this manner, the touch sensor 110 may specifically be a layer of indium tin oxide (indium tin oxide. ITO) thin film, and the ITO thin film may be adhered as a touch sensor 110 layer onto the polarizer 16.

Figure 20A:
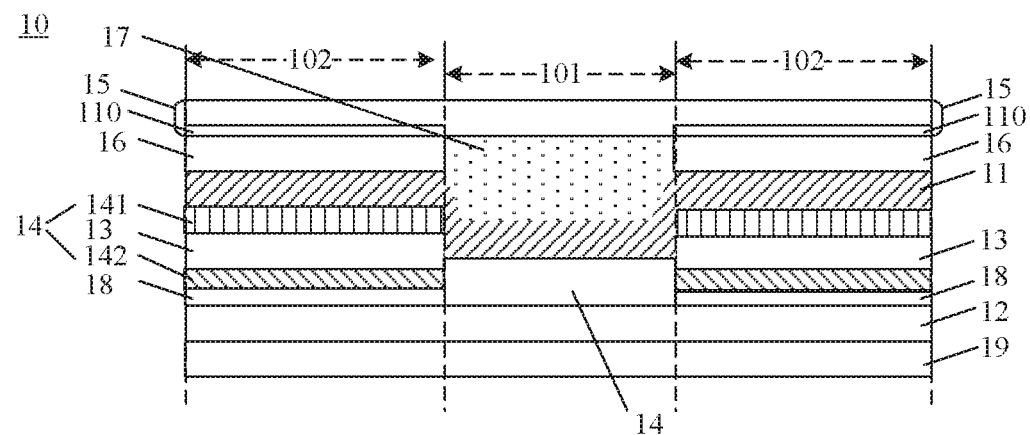
FIG. 20a is a sectional view of another screen according to an embodiment of this application.

For example, referring to FIG. 20a, in the OGS manner, in the second part 102 of the OLED screen 10, the touch sensor 110 is integrated into the cover 15.

Figure 20B:
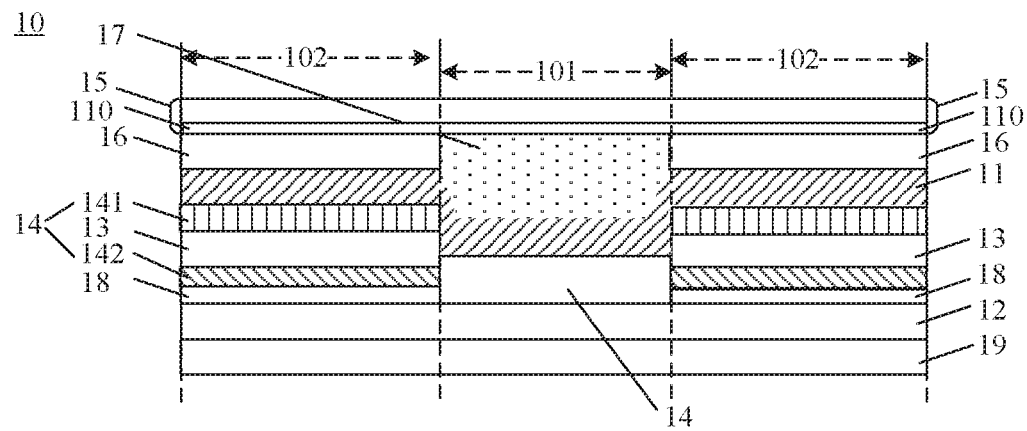
FIG. 20b is a sectional view of another screen according to an embodiment of this application.

For example, referring to FIG. 20b, in the OGS manner, in the first part 101 and the second part 102 of the OLED screen 10, the touch sensor 110 is integrated into the cover 15.

In another arrangement manner, the touch sensor 110 may alternatively be disposed in the organic light emitting layer 13 of the OLED screen (for example, the incell manner) or disposed below the organic light emitting layer 13 of the OLED screen (for example, the undercell manner). Details are not described herein.

Figure 21:
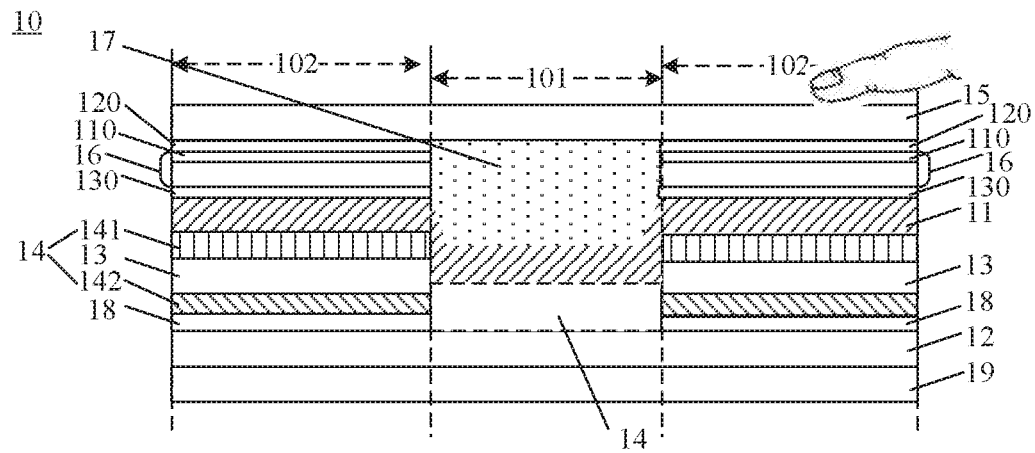
FIG. 21 is a sectional view of another screen according to an embodiment of this application.

Further, referring to FIG. 21, in the second part 102 of the OLED screen 10, the OLED screen 10 further includes a second clear colloid 120 and a third clear colloid 130. The second clear colloid 120 is located between the polarizer 16 and the cover 15, and the third clear colloid 130 is located between the polarizer 16 and the encapsulation layer 11. In this way, the second clear colloid 120 can enable the polarizer 16 and the cover 15 to be tightly bonded, the third clear colloid 130 can enable the polarizer 16 and the encapsulation layer 11 to be tightly bonded, and air between the polarizer 16 and the cover 15 and air between the polarizer 16 and the encapsulation layer 11 can be exhausted, avoiding impact of harmful substances in air on the polarizer 16, the encapsulation layer 11, the cover 15, or another component of the OLED screen 10. Similar to the first clear colloid 17, the second clear colloid 120 herein may specifically be an OCA or an OCR.

In a specific implementation of FIG. 21, a thickness of the second clear colloid 120 may be 100 μm, a thickness of the polarizer 16 may be 147 μm, a thickness of the touch sensor 110 thin film disposed on the polarizer 16 may be 60 μm, and a thickness of the third clear colloid 130 may be 100 μm. The encapsulation layer 11 may be a thin film encapsulation layer 11 whose thickness may be 22 μm. The thin film encapsulation layer 11 herein may include one or two organic layers and two non-organic layers. A thickness of the organic layer may be 10 μm, and a thickness of the non-organic layer may be 1 μm. In addition, a thickness of the common layer 14 may be less than 1 μm, a thickness of the substrate 12 may be 20 μm, and a thickness of the rear film 19 may be 100 μm.

Figure 22:
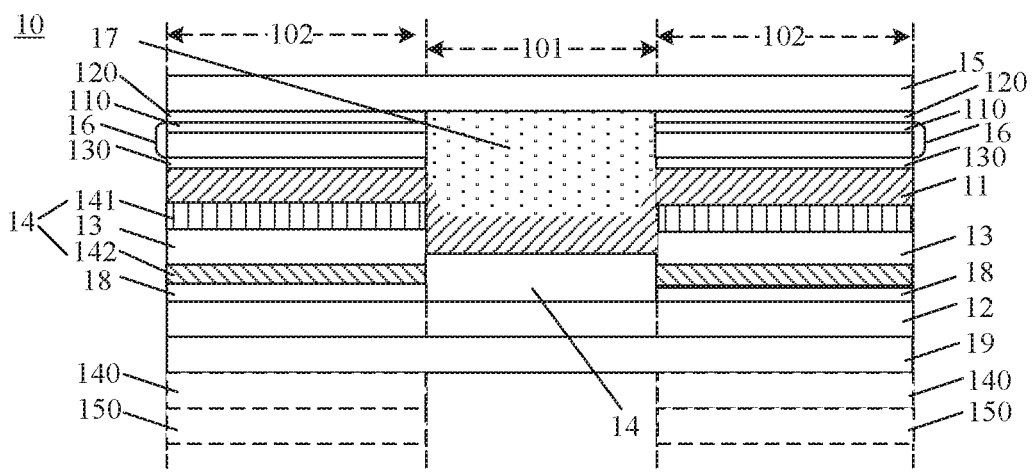
FIG. 22 is a sectional view of another screen according to an embodiment of this application.

Furthermore, referring to FIG. 22, in this embodiment of this application, in the second part 102 of the OLED screen 10, the OLED screen 10 may further include at least one of a cushion (cushion) layer 140 or a heat sink layer 150, where the heat sink layer 150 includes a metal sheet or a graphite (graphite) sheet.

The cushion layer 140 herein may be configured to reduce an external shock on each device in the OLED screen 10, and the heat sink layer 150 is configured to dissipate heat generated inside the OLED screen 10. For example, the heat sink layer 150 may specifically be a metal sheet such as a copper sheet, an aluminum sheet or a silver sheet, or may be a graphite sheet, or may be made of another material having a relatively high thermal conductivity coefficient.

In addition, in the second part 102 of the OLED screen 10, the OLED screen 10 may further include at least one of the cushion layer 140 or the heat sink layer 150, but in the first part 101 of the OLED screen 10, the OLED screen 10 does not include the cushion layer 140 and the heat sink layer 150. Therefore, a position that is below the OLED screen 10 and that corresponds to the first part 101 may be used as space for the optical device 21 such as the camera 22, so that at least a part of the optical device 21 such as the camera 22 can be disposed in the cushion layer 140 or the heat sink layer 150 in the second part 102, so as to be built inside the OLED screen 10 to reduce a thickness of the OLED screen 10 as much as possible.

In addition, in this embodiment of this application, to enable the OLED screen 10 to display a graphical user interface better, or to improve a touch effect of the OLED screen 10, the OLED screen 10 may further include some other components. Details are not described herein.

It should be noted that, as learned from FIG. 4a to FIG. 22, in the first part 101 of the OLED screen 10, the OLED screen 10 may not include at least one of the polarizer 16, the light emitting layer 13, the common layer 14, the back plane 18, the cushion layer 140, or the heat sink layer 150. Therefore, in a process of fabricating the OLED screen 10, layers that are in the OLED screen 101 and that correspond to the first part 101 may not be fabricated or may be removed. For example, in a process of fabricating the polarizer 16, the back plate 18, the buffer layer 140, and the heat sink layer 150, the polarizer 16, the back plate 18, the buffer layer 140, and the heat sink layer 150 that correspond to the first part 101 may be removed in manners of laser cutting, computer numerical control (computer numerical control, CNC) grinding, cutting wheel processing, and the like. For another example, the light emitting layer 13 may be fabricated by using a fine metal mask (fine metal mask, FMM). The FMM may specifically be a pattern mask (pattern mask). Specifically, a pattern mask corresponding to the first part 101 may be disposed as a solid mask so as to skip fabricating a light emitting layer part corresponding to the first part 101.

Figure 23A:
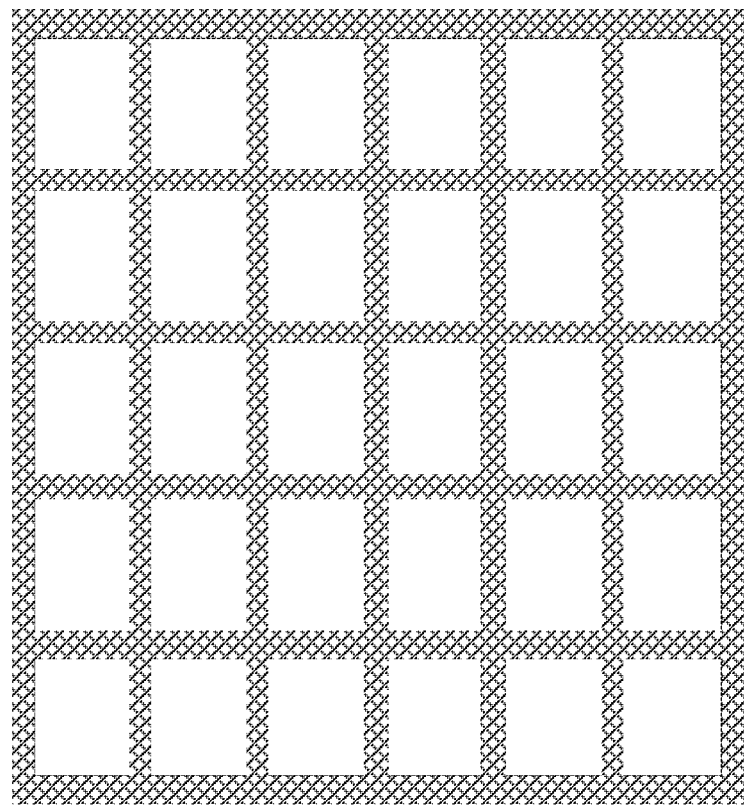
FIG. 23a is a schematic diagram of an open mask according to an embodiment of this application.
Figure 23B:
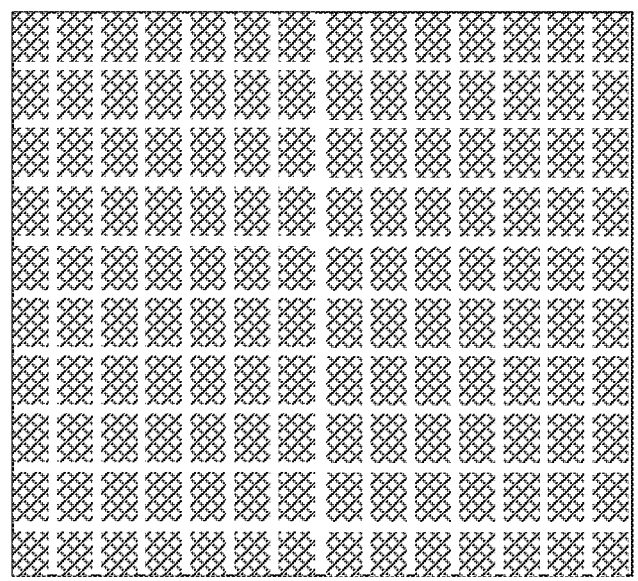
FIG. 23b is a schematic diagram of a pattern mask according to an embodiment of this application.

In addition, unlike the pattern mask used in the light emitting layer 13, an open mask (open mask) may be used to fabricate the common layer 14. For a schematic diagram of the open mask, refer to the part filled with grids in FIG. 23a. For a schematic diagram of the pattern mask, refer to the part filled with grids in FIG. 23b. The open mask is a hollow-out mask, and hollow-out positions are correspondingly used to fabricate the common layer 14. The pattern mask is a mask provided with a plurality of solid small squares, and positions of the solid small squares are correspondingly used to fabricate the light emitting layer 13.

In addition, it should be noted that when the first part 101 of the OLED screen 10 further includes other layers than the encapsulation layer 11, the substrate 12, and the common layer 14, the other layers have relatively high transmittances, so that an overall transmittance of the first part 101, of the OLED screen 10, that is formed by stacking the layers is greater than or equal to a preset value. Details are not described herein again.

Figure 24:
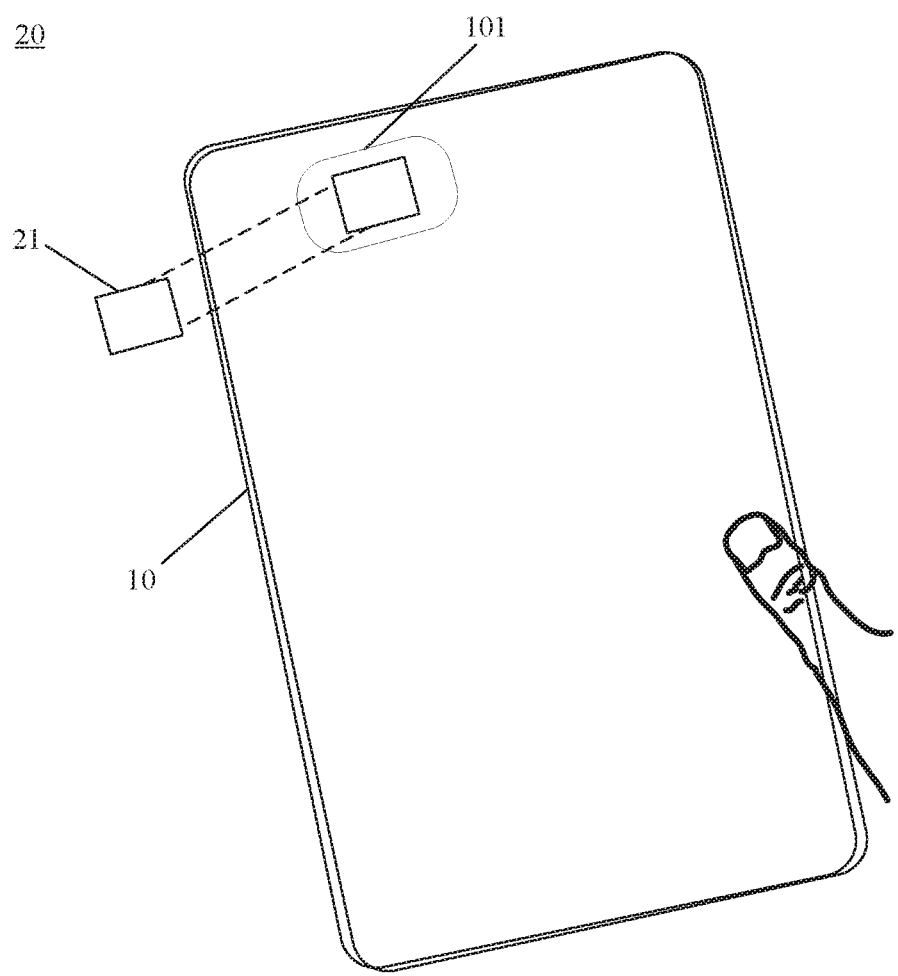
FIG. 24 is a schematic structural diagram of a terminal according to an embodiment of this application.

An embodiment of this application further provides a terminal 20. Referring to FIG. 24, the terminal 20 may be a mobile phone or any other terminal 20 device including the OLED screen 10 shown in FIG. 4a to FIG. 23. The terminal 20 may further include an optical device 21.

Specifically, the OLED screen 10 may include an encapsulation layer 11 and a substrate 12 disposed below the encapsulation layer 11. In a first part 101 of the OLED screen 10, the encapsulation layer 11 is bonded to the substrate 12. The optical device 21 is disposed at a position that is below the OLED screen 10 and that corresponds to the first part 101. In a second part 102 of the OLED screen 10, the OLED screen 10 further includes a light emitting layer 13, where the light emitting layer 13 is disposed between the encapsulation layer 11 and the substrate 12, and the light emitting layer 13 includes red light emitting pixels, green light emitting pixels, and blue light emitting pixels.

A transmittance of the first part 101 of the OLED screen 10 is greater than or equal to a preset value. In other words, the first part 101 of the OLED screen 10 may be transparent. The second part 102 of the OLED screen 10 is configured to display a graphical user interface GUI. The optical device 21 may include at least one of a camera 22, an indicator lamp 23, a light sensor, or a distance sensor.

In this way, in the first part 101 and the second part 102 of the OLED screen 10, layers inside the OLED screen 10 are tightly bonded. Therefore, harmful substances such as moisture in air can be prevented from entering the inside of the OLED screen 10.

In addition, because the first part 101 of the OLED screen 10 is transparent, the OLED screen 10 corresponding to the first part 101 may also be referred to as a transparent window. In this way, when the optical device 21 such as the camera 22 is disposed below the transparent window, the transparent window does not affect incidence and emission of light for the optical device 21 such as the camera 22. For example, when the camera 22 is disposed below the OLED screen 10 directly under the first part 101, the camera can normally shoot an image.

In addition, because the first part 101 (the transparent window) may be disposed at any position of the OLED screen 10, the optical device 21 below the transparent window may also be correspondingly disposed at any position of the OLED screen 10 without being limited to an edge position of the OLED screen 10.

Figure 25:
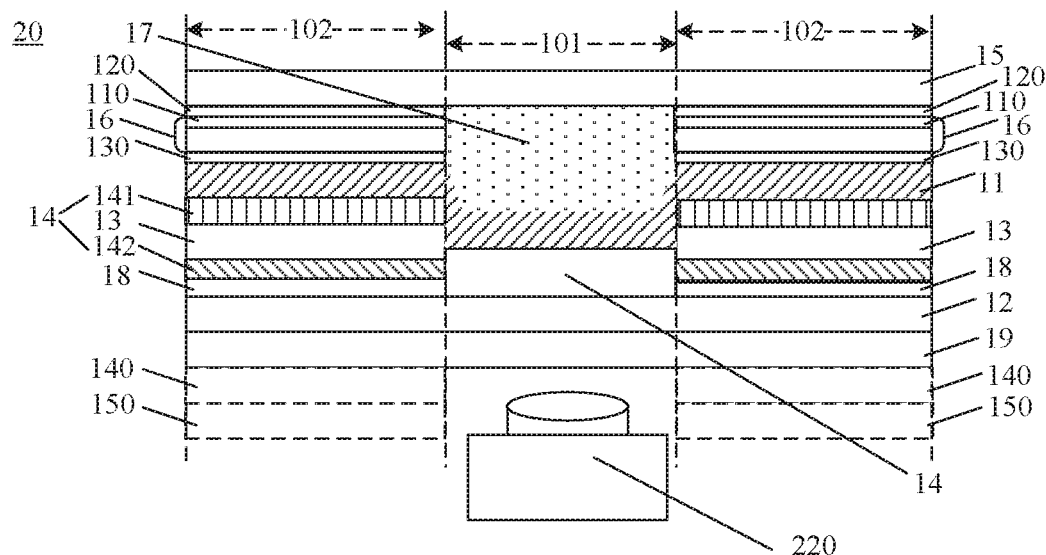
FIG. 25 is a sectional view of a terminal according to an embodiment of this application.
Figure 26:
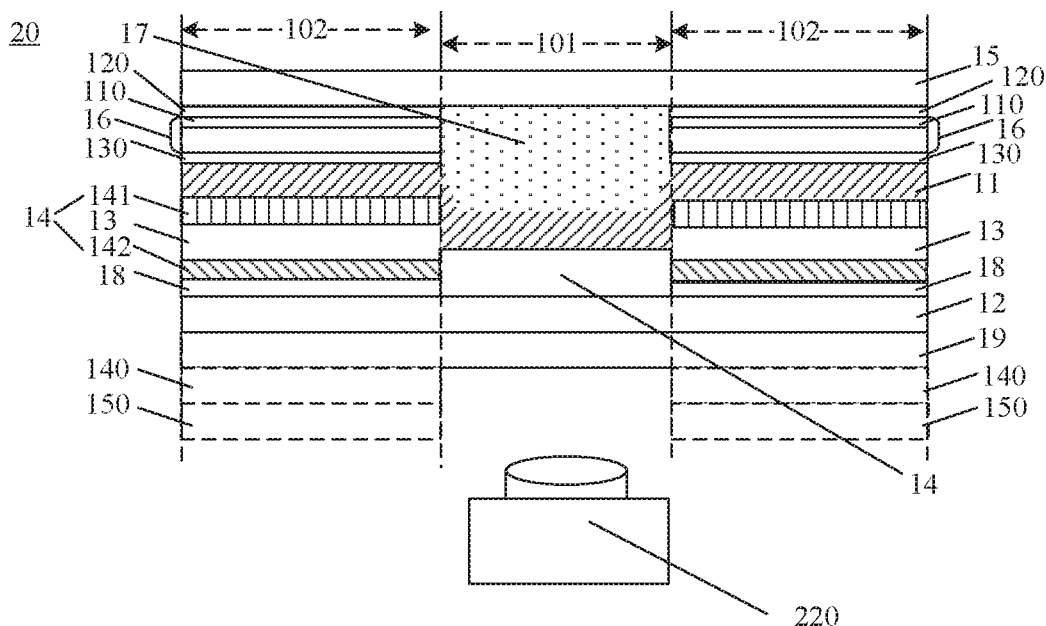
FIG. 26 is a sectional view of another terminal according to an embodiment of this application.

In an implementation, below the transparent window, at least one part of the optical device 21 may be built inside the OLED screen 10. For example, when the optical device 21 is the camera 22, referring to FIG. 25, the camera 22 may specifically be a shooting component 220. The shooting component 220 may further include a component, such as a sensor that cooperates with the camera 22, and at least one part of the shooting component 220 may be built inside the OLED screen 10. In this way, internal space of the OLED screen 10 may be sufficiently utilized, so that a structure inside the OLED screen 10 is more compact, reducing a thickness of the OLED screen as much as possible.

Figure 27:
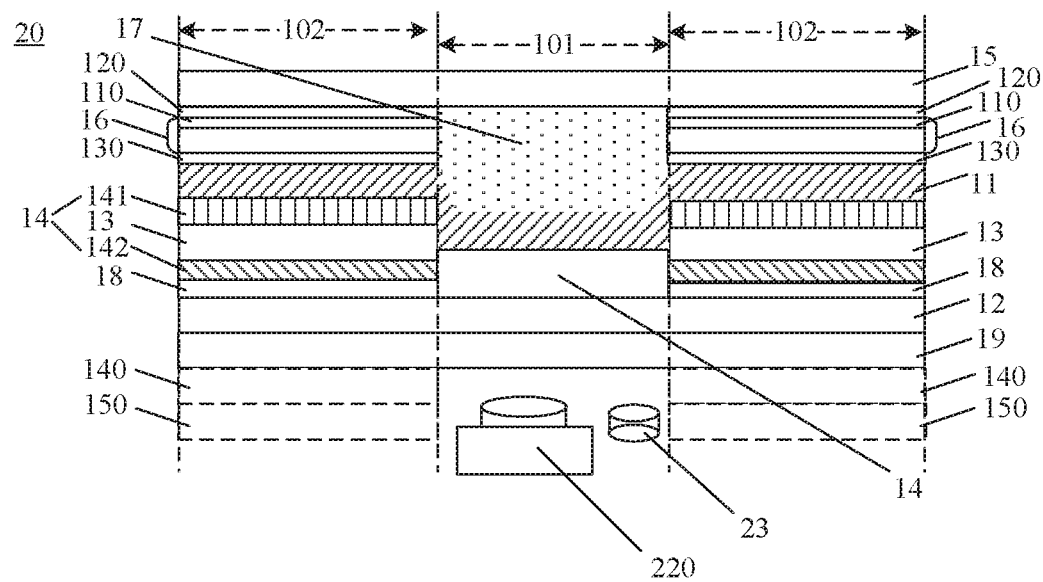
FIG. 27 is a sectional view of another terminal according to an embodiment of this application.

Certainly, the optical device 21 may alternatively not be built inside the OLED screen 10. For example, when the optical device 21 is the shooting component 220, referring to FIG. 27, the shooting component 220 may alternatively not be built inside the OLED screen 10, but may be disposed completely below the OLED screen 10. This is not limited in this embodiment of this application.

Figure 28:
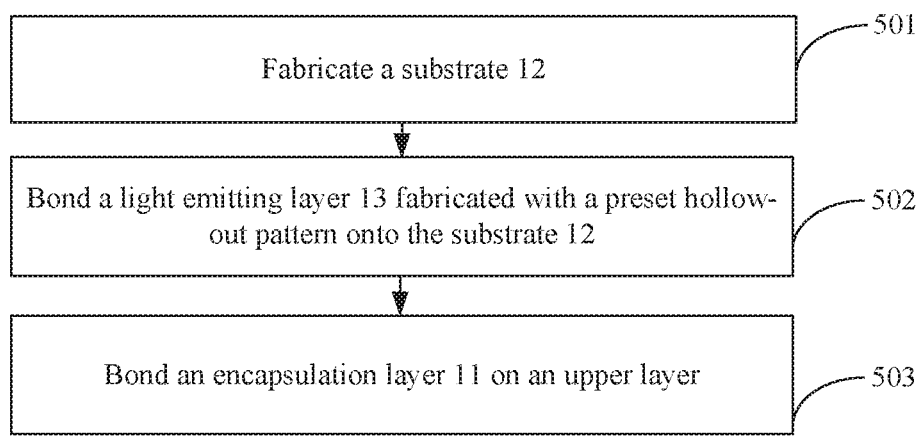
FIG. 28 is a flowchart of a screen fabrication method according to an embodiment of this application.

The optical device 21 herein is usually a device that needs to be disposed on a front panel of the terminal 20 and needs to perform light interaction with the outside. For example, the optical device 21 may alternatively be an indicator lamp, a light sensor, a distance sensor, or the like. Referring to FIG. 28, in addition to the camera 22, another optical device 21, for example, the indicator lamp 23, may also be disposed below the transparent window.

Further, in this embodiment of this application, the OLED screen 10 may further include a common layer 14 disposed between the encapsulation layer 11 and the substrate 12, where the encapsulation layer 11 and the substrate 12 are configured to isolate the common layer 14 from air, and the common layer 14 includes at least one of a hole layer or an electron layer. In the first part 101 of the OLED screen 10, the common layer 14 is bonded to the substrate 12, and the encapsulation layer 11 is bonded to the common layer 14. In the second part 102 of the OLED screen 10, the common layer 14 includes a first sublayer 141 and a second sublayer 142, and the light emitting layer 13 is located between the first sublayer 141 and the second sublayer 142.

The hole layer includes a hole injection layer and a hole transfer layer, the electron layer includes an electron injection layer and an electron transfer layer, the first sublayer 141 includes a cathode, a capping layer, the electron injection layer, and the electron transfer layer, the second sublayer 142 includes the hole transfer layer and the hole injection layer, and the second sublayer 142 is located below the first sublayer 141.

Furthermore, in the second part 102 of the OLED screen 10, the OLED screen 10 further includes a back plane 18, where a thin film transistor TFT is disposed on the back plane 18, and the back plane 18 is disposed between the second sublayer 142 and the substrate 12.

Further, an anode is disposed on the back plane 18.

In the second part 102 of the OLED screen 10, the OLED screen 10 further includes a touch sensor 110.

Furthermore, in the first part 101 of the OLED screen 10, the OLED screen 10 further includes a touch sensor 110.

Further, the OLED screen 10 includes a cover 15, where the cover 15 is disposed on an upper layer of the encapsulation layer 11.

Further, in the second part 102 of the OLED screen 10, the OLED screen 10 further includes a polarizer 16, where the polarizer 16 is disposed between the encapsulation layer 11 and the cover 15.

Further, in the first part 101 of the OLED screen 10, the OLED screen 10 further includes a first clear colloid 17, where the first clear colloid 17 is configured to fill a gap between the encapsulation layer 11 and the cover 15.

The first clear colloid 17 includes an optical clear resin OCR or an optical clear adhesive OCA.

Further, in the second part 102 of the OLED screen 10, the OLED screen 10 further includes a second clear colloid 120 and a third clear colloid 130. The second clear colloid 120 is located between the polarizer 16 and the cover 15. The third clear colloid 130 is located between the polarizer 16 and the encapsulation layer 11.

The OLED screen 10 provided in this embodiment of this application with the foregoing structure may specifically be fabricated using a plurality of methods. For example, referring to FIG. 29, an embodiment of this application provides a specific method for fabricating an OLED screen 10. The method may include the following steps.

501. Fabricate a substrate 12.

The substrate 12 has a high transmittance.

502. Bond a light emitting layer 13 fabricated with a preset hollow-out pattern onto the substrate 12.

503. Bond an encapsulation layer 11 on an upper layer.

The encapsulation layer 11 has a high transmittance.

Layers inside the OLED screen 10 formed through step 501 to step 503 are bonded to each other, and harmful substances such as moisture in air can be prevented from entering the inside of the OLED screen 10.

The preset hollow-out pattern herein may have a same shape as that of the foregoing first part 101, and the encapsulation layer 11 and the substrate 12 have high light transmittances. Therefore, the first part 101 of the OLED screen 10 may be transparent. In this way, incidence and emission of light for an optical device 21 disposed at a position that is below the OLED screen 10 and that corresponds to the first part 101 are not affected. In addition, the preset hollow-out pattern may be disposed at any position of the OLED screen 10. Therefore, corresponding to the hollow-out pattern, the first part 101 and the optical device 21 can also be disposed at any position of the OLED screen 10 without being limited to an edge position of the OLED screen 10.

Further, referring to FIG. 30, after the foregoing step 501, the method may further include the following step:

504. Bond a back plane 18 having a preset hollow-out pattern.

Before step 502, the method may further include the following step:

505. Bond a second sublayer 142 of a common layer 14.

After step 502, the method may further include the following step:

506. Bond a first sublayer 141 of the common layer 14.

After step 503, the method may further include the following steps:

507. Bond a polarizer 16 provided with a preset hollow-out pattern.

508. Bond a cover 15.

A fabrication sequence of the OLED screen 10 shown in FIG. 30 may roughly be: a base board—the back plane 18—the common layer 14 (the first sublayer 141)—the light emitting layer 13—the common layer 14 (the second sublayer 142)—the encapsulation layer 11—the polarizer 16—the cover 15.

Figure 29:
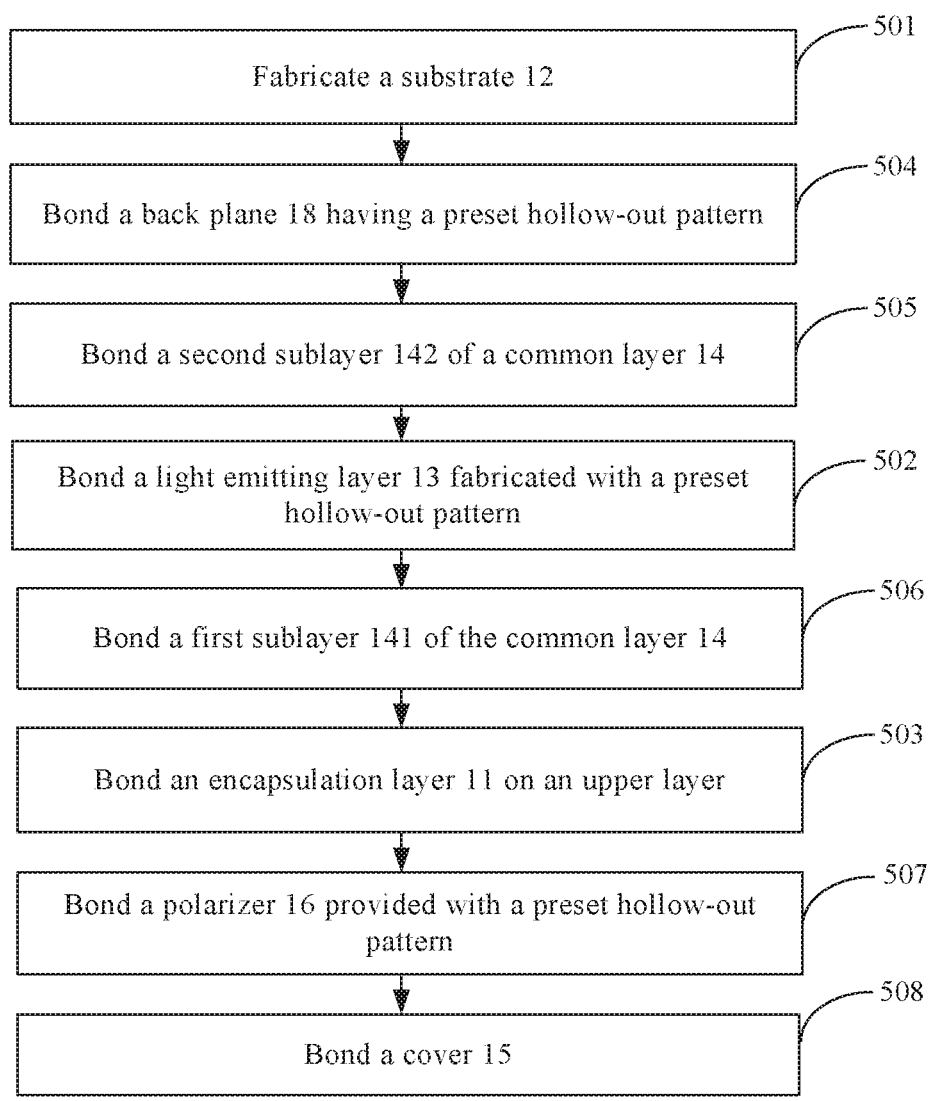
FIG. 29 is a flowchart of another screen fabrication method according to an embodiment of this application.

It should be noted that fabrication sequences shown in the foregoing FIG. 29 and FIG. 30 are merely example descriptions of the method for fabricating an OLED screen 10 provided in the embodiments of this application, and constitute no limitation.

The foregoing descriptions are merely specific implementations of the embodiments of this application, but are not intended to limit the protection scope of the embodiments of this application. Any variation or replacement readily figured out by a person skilled in the art within the technical scope disclosed in the embodiments of this application shall fall within the protection scope of the embodiments of this application. Therefore, the protection scope of the embodiments of this application should be subject to the protection scope of the claims.

What is claimed is:

1. A terminal, comprising:
    an optical device; and
    an organic light emitting display (OLED) screen coupled to the optical device, wherein the OLED screen comprises:
        an encapsulation layer;
        a substrate disposed below the encapsulation layer;
        a first part, wherein in the first part, the encapsulation layer is bonded to the substrate, and the optical device is disposed at a position that is below the OLED screen and corresponding to the first part;
        a light emitting layer comprising red light emitting pixels, green light emitting pixels, and blue light emitting pixels; and
        a second part, wherein the light emitting layer is disposed between the encapsulation layer and the substrate in the second part.

2. The terminal of claim 1, wherein a part of the optical device is built inside the OLED screen.

3. The terminal of claim 1, wherein the optical device comprises at least one of a camera, an indicator lamp, a light sensor, or a distance sensor.

4. The terminal of claim 1, wherein the OLED screen further comprises a common layer disposed between the encapsulation layer and the substrate, wherein the encapsulation layer and the substrate are configured to isolate the common layer from air, wherein the common layer comprises at least one of a hole layer or an electron layer, wherein, in the first part, the common layer is bonded to the substrate and the encapsulation layer is bonded to the common layer, and wherein, in the second part, the common layer comprises a first sublayer and a second sublayer and the light emitting layer is located between the first sublayer and the second sublayer.

5. The terminal of claim 4, wherein the hole layer comprises a hole injection layer and a hole transfer layer, wherein the electron layer comprises an electron injection layer and an electron transfer layer, wherein the first sublayer comprises a cathode, a capping layer, the electron injection layer, and the electron transfer layer, wherein the second sublayer comprises the hole transfer layer and the hole injection layer, and wherein the second sublayer is located below the first sublayer.

6. The terminal of claim 5, further comprising a thin film transistor (TFT), wherein the OLED screen further comprises a back plane in the second part, wherein the TFT is disposed on the back plane, and wherein the back plane is disposed between the second sublayer and the substrate.

7. The terminal of claim 1, wherein the OLED screen further comprises a touch sensor in the second part.

8. The terminal of claim 7, wherein the OLED screen further comprises the touch sensor in the first part.

9. The terminal of claim 7, wherein the OLED screen further comprises a cover disposed on an upper layer of the encapsulation layer.

10. The terminal of claim 9, wherein the OLED screen further comprises a polarizer in the second part, and wherein the polarizer is disposed between the encapsulation layer and the cover.

11. The terminal of claim 10, wherein the OLED screen further comprises a first clear colloid and a second clear colloid in the second part, wherein the first clear colloid is located between the polarizer and the cover, and wherein the second clear colloid is located between the polarizer and the encapsulation layer.

12. The terminal of claim 9, wherein the OLED screen further comprises a clear colloid in the first part, and wherein the clear colloid is configured to fill a gap between the encapsulation layer and the cover.

13. The terminal of claim 12, wherein the clear colloid comprises an optical clear resin (OCR) or an optical clear adhesive (OCA).

14. The terminal of claim 1, wherein a transmittance of the first part is greater than or equal to a preset value.

15. An organic light emitting display (OLED) screen, comprising:
    an encapsulation layer;
    a substrate disposed below the encapsulation layer;
    a first part, wherein the encapsulation layer is bonded to the substrate in the first part;
    a light emitting layer comprising red light emitting pixels, green light emitting pixels, and blue light emitting pixels; and
    a second part, wherein the light emitting layer is disposed between the encapsulation layer and the substrate in the second part,
    wherein a position that is below the OLED screen and that corresponds to the first part is configured to receive an optical device.

16. The OLED screen of claim 15, wherein the optical device comprises at least one of a camera, an indicator lamp, a light sensor, or a distance sensor.

17. The OLED screen of claim 15, further comprising a common layer disposed between the encapsulation layer and the substrate, wherein the encapsulation layer and the substrate are configured to isolate the common layer from air, wherein the common layer comprises at least one of a hole layer or an electron layer, wherein, in the first part, the common layer is bonded to the substrate and the encapsulation layer is bonded to the common layer, and wherein, in the second part, the common layer comprises a first sublayer and a second sublayer and the light emitting layer is located between the first sublayer and the second sublayer.

18. The OLED screen of claim 17, wherein the hole layer comprises a hole injection layer and a hole transfer layer, wherein the electron layer comprises an electron injection layer and an electron transfer layer, wherein the first sublayer comprises a cathode, a capping layer, the electron injection layer, and the electron transfer layer, wherein the second sublayer comprises the hole transfer layer and the hole injection layer, and wherein the second sublayer is located below the first sublayer.

19. The OLED screen of claim 18, further comprising a thin film transistor (TFT), wherein the OLED screen further comprises a back plane in the second part, wherein the TFT is disposed on the back plane, and wherein the back plane is disposed between the second sublayer and the substrate.

20. An organic light emitting display (OLED) screen, comprising:
- an encapsulation layer;
- a substrate disposed below the encapsulation layer;
- a first part, wherein the encapsulation layer is bonded to the substrate in the first part;
- a light emitting layer comprising red light emitting pixels, green light emitting pixels, and blue light emitting pixels;
- a second part, wherein the light emitting layer is disposed between the encapsulation layer and the substrate in the second part; and
- a common layer disposed between the encapsulation layer and the substrate, wherein the encapsulation layer and the substrate are configured to isolate the common layer from air, wherein the common layer comprises at least one of a hole layer or an electron layer, wherein, in the first part, the common layer is bonded to the substrate and the encapsulation layer is bonded to the common layer, and wherein, in the second part, the common layer comprises a first sublayer and a second sublayer and the light emitting layer is located between the first sublayer and the second sublayer.

* * * * *